(12) United States Patent
Hofmann et al.

(10) Patent No.: US 6,812,990 B1
(45) Date of Patent: Nov. 2, 2004

(54) METHOD FOR MAKING SOL GEL SPACERS FOR FLAT PANEL DISPLAYS

(75) Inventors: James J. Hofmann, Boise, ID (US); Brian A. Vaartstra, Nampa, ID (US); Brenda D. Kraus, Boise, ID (US); Donald L. Westmoreland, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/560,260

(22) Filed: Apr. 26, 2000

(51) Int. Cl.[7] .................... G02F 1/1339; B29C 59/00; B05D 5/12
(52) U.S. Cl. .................... 349/156; 349/155; 264/129; 427/133
(58) Field of Search .................. 427/77, 105, 106, 427/133; 349/155, 156; 264/61, 272.11, 129; 438/624; 445/24; 216/25, 33

(56) References Cited

U.S. PATENT DOCUMENTS

| | | | |
|---|---|---|---|
| 5,242,647 A | | 9/1993 | Poco .................. 264/225 |
| 5,275,796 A | | 1/1994 | Tillotson et al. ........ 423/338 |
| 5,492,234 A | * | 2/1996 | Fox, III .................. 216/25 |
| 5,503,582 A | * | 4/1996 | Cathey et al. ............ 445/24 |
| 5,658,832 A | | 8/1997 | Bernhardt et al. ...... 264/272.11 |
| 5,930,890 A | * | 8/1999 | Chou et al. .............. 29/852 |
| 6,168,737 B1 | * | 1/2001 | Poco et al. .............. 264/129 |

OTHER PUBLICATIONS

Lorenz et al, *Sensors & Activators*, 64:33–39 (1998).
Lorenz et al, *J. Micromech. Microeng.*, 7:121–124 (1997).
Ulrich, *Chemtech*, pp. 242–249 (Apr. 1988).
Shoup, *Colloid Interface Science*, 3:63–69 (1976).
*Ultrastructure Processing of Ceramics, Glasses, and Composites*, Hench and Ulrich, eds., Wiley–Interscience Publication, pp. 76–87.

* cited by examiner

Primary Examiner—Tarifur R. Chowdhury
(74) Attorney, Agent, or Firm—Wilmer Cutler Pickering Hale and Dorr LLP

(57) ABSTRACT

The present invention describes thick film photolithographic molds, methods of making thick film photolithographic molds, and methods of using thick film photolithographic molds to form spacers on a substrate. The thick film photolithographic molds preferably comprise an epoxy bisphenol A novolac resin. The present invention also describes sol gel spacers comprising sodium silicates and potassium silicates. The thick film photolithographic molds and sol gel spacers of the present invention can be used in flat panel displays, such as field emission displays and plasma displays.

6 Claims, 15 Drawing Sheets

METHOD FOR MAKING SOL GEL SPACERS FOR FLAT PANEL DISPLAYS

The present invention was made with Government support under Contract No. DABT63-97-C-0001 awarded by the Advanced Research Projects Agency (ARPA). The Government may have certain rights in this invention.

FIELD OF THE INVENTION

The present invention describes thick film photolithographic molds, methods of making thick film photolithographic molds, and methods of using thick film photolithographic molds to form spacers on a substrate. The thick film photolithographic molds preferably comprise an epoxy bisphenol A novolac resin. The present invention also describes sol gel spacers comprising sodium silicates and potassium silicates. The thick film photolithographic molds and sol gel spacers of the present invention can be used in flat panel displays, such as field emission displays and plasma displays.

BACKGROUND OF THE INVENTION

FIG. 1 shows a cross sectional view of a portion of a prior art FED 100. FED 100 includes a cathode, or baseplate 102 and an anode, or faceplate 104. Baseplate 102 includes a substrate 106, a plurality of conical field emitters 108, an insulating layer 110, and a conductive grid layer 112. Insulating layer 110 is disposed over substrate 106, and grid layer 112 is disposed over insulating layer 110. Insulating layer 110 defines a plurality of void regions 114, and each emitter 108 is disposed over substrate 106 in one of the void regions 114. Grid layer 112 defines a plurality of apertures 116. Each aperture 116 corresponds to, and overlies, one of the void regions 114. The apertures 116 are positioned so that (1) the grid layer 112 does not obstruct a path 117 between the upper tips of the emitters 108 and the faceplate 104 and (2) a portion of the grid layer 112 is proximal to the tip of each emitter 108. Baseplate 102 also includes a plurality of conductive row and column lines 118 disposed between emitters 108 and substrate 106.

Faceplate 104 includes a glass plate 120, a transparent conductor 122, and a phosphor layer 124. Transparent conductor 122 is disposed on one major surface of glass plate 120, and phosphor layer 124 is disposed on transparent conductor 122. The faceplate 104 and baseplate 102 are spaced apart from one another and are disposed so that the phosphor layer 124 is proximal to the grid layer 112.

FED 100 also includes a plurality of spacers 130 disposed between the faceplate 104 and baseplate 102. The spacers 130 maintain the orientation between baseplate 102 and faceplate 104 so that the baseplate and faceplate are substantially parallel to one another. Outer walls (not shown) seal the outer periphery of FED 100 and the space between baseplate 102 and faceplate 104 is substantially evacuated. Since the space between faceplate 104 and baseplate 102 is substantially evacuated, atmospheric pressure tends to press baseplate 102 and faceplate 104 together. However, spacers 130 resist this pressure and maintain the spacing between baseplate 102 and faceplate 104.

FED 100 also includes a power supply 140 for (1) charging the transparent conductor 122 to a highly positive voltage; (2) charging the grid layer 112 to a positive voltage; and (3) selectively charging selective ones of the row and column lines 118 to a negative voltage.

In operation, voltages applied to the row and column lines 118, the grid layer 112, and the transparent conductor 122 cause emitters 108 to emit electrons 150 that travel along path 117 towards, and impact on, phosphor layer 124. Incident electrons 150 on phosphor layer 124 cause phosphor layer 124 to emit photons and thereby generate a visible display on faceplate 104.

The visible display of FED 100 is normally arranged as a matrix of pixels. Each pixel in the display is typically associated with a group of emitters 108, with all the emitters 108 in a group being dedicated to controlling the brightness of their associated pixel. For example, FIG. 1 shows a single pixel 160, with pixel 160 being associated with emitters 108a, 108b, 108c, and 108d. Pixel 160 could be a single pixel of a black and white display or a single red, green, or blue dot associated with a single pixel of a color display. Charging line 118a to a negative voltage simultaneously activates emitters 108a–d causing emitters 108a–d to emit electrons that travel towards and impact on phosphor layer 124 in the region of pixel 160. Normally, the row and column lines are arranged so that the emitters associated with one pixel can be controlled independently of all other emitters in the display and so that all emitters associated with a single pixel are controlled in unison.

The top of each spacer 130 contacts a portion of faceplate 104. Electrons emitted by emitters 108 can not impact phosphor layer 124 in the regions where the spacers 130 touch the phosphor layer 124. So, each spacer 130 creates a black, or dark, region of the display that can not be illuminated. The presence of dark regions created by spacers 130 does not significantly degrade the quality of the display of FED 100 as long as the area of the dark regions is small compared with the area of the illuminated pixels. Four or more spacers 130 are normally disposed around the periphery of each pixel. It is therefore important for the cross section of the spacers 130 to be relatively small compared with the area of each pixel. Ideally, the spacers 130 are characterized by a relatively high aspect ratio (i.e., the spacer's height is larger than its width). Such a high aspect ratio (1) does not create dark regions large enough to degrade the display quality and (2) provides sufficient spacing between the baseplate 102 and faceplate 104 to permit electrons traveling from emitters 108 towards faceplate 102 to acquire sufficient energy to cause phosphor layer 124 to emit photons. The spacers 130 must also provide sufficient structural strength to resist the atmospheric pressure and thereby maintain the desired spacing between baseplate 102 and faceplate 104. It is also desirable for all spacers 130 to have exactly the same height so they can provide uniform spacing between the baseplate 102 and the faceplate 104. It is also important for the spacers to be properly aligned with respect to the array of pixels so the dark regions created where the spacers 130 contact the faceplate do not interfere with the display (e.g., it is desirable for the bottom of the spacers 130 to contact the grid layer 112 at selected locations that are between the apertures 116 and are equidistant from all the adjacent emitters). Since the spacers 130 are disposed within a vacuum, it is also important for the spacers to be formed from a vacuum compatible material (e.g., a material that does not outgas significantly).

Prior art spacers 130 are typically constructed using glass posts. After the posts are prepared they are bonded to the grid layer 112. Following this bonding, the faceplate 104 is fitted onto the posts. Functioning FEDs may be constructed using these techniques, however, these techniques have several disadvantages. For example, when the spacers are fabricated from glass posts, it is difficult to insure that every spacer has precisely the same height. Variation in spacer height degrades the parallel alignment between the faceplate and baseplate and thereby degrades the quality of the FED. Another problem with prior art spacer manufacturing techniques is that they do not permit precise alignment of the spacers with respect to the pixel array. As stated above, any deviation from the desired alignment can cause the dark regions created where the spacers contact the faceplate 104 to degrade the quality of the display. Ideally, the bottom of each spacer 130 contacts the grid layer 112 at a point that is equidistant from all the adjacent emitters, however, prior art spacer manufacturing techniques make it difficult to achieve this ideal. It would therefore be desirable to develop a new technique for fabricating spacers 130 for use in FEDs that provides improved control in manufacturability.

The use of porous, low-density xerogel materials for forming spacers in field emission flat panel displays and vacuum microelectronics is described in U.S. Pat. No. 5,658,832. In the methods described therein, a mold is placed on a substrate, such as the baseplate or faceplate in a field emission flat panel display. A mold release agent, such as glycerol, silicone or wax, is applied to the mold, and then a liquid xerogel precursor is placed in the mold. After the xerogel hardens, the mold is removed, such that a xerogel spacer is formed on the base plate or face plate. There are several problems associated with this process. First, the positive mold was created by using a saw to remove material from a four inch by four inch square substrate and thereby form an array of posts. Molds larger than four inches by four inches are generated by aligning an array of four inch by four inch tiles. These methods prevent the posts from being accurately positioned. Second, the posts formed by the techniques disclosed therein tend to be contaminated by air bubbles. That is, air bubbles tend to form near the base of the posts thereby weakening the posts as well as weakening the attachment between the posts and the substrate.

There is a need in the art for new and improved materials for spacers for flat panel displays, and for new and improved methods for forming the spacers on the face plates and base plates in flat panel displays. The present invention is directed to these, as well as other, important ends.

SUMMARY OF THE INVENTION

The present invention comprises methods of making and using molds for forming spacers for flat panel displays. Preferably, photolithography is used to make the molds. Molds are fabricated by depositing a thick film of photoresist, or photolithographic material, onto a support and by using photolithography to pattern the thick film photoresist into a shape for a desired mold. Positive molds define an array of posts, each of the posts corresponding to one spacer of the display that will ultimately be formed by the molding process. Negative molds define a plurality of apertures, each aperture corresponding to one spacer of the display that will ultimately be formed by the molding process. The photoresist can be patterned to form either positive molds (with arrays of posts) or negative molds (defining arrays of apertures).

One preferred thick film photoresist for use in fabricating the molds comprises an epoxy bisphenol A novolac resin, such as EPON® Resin SU-8. Methods are disclosed below for depositing a thick film of an epoxy bisphenol A novolac resin onto a support (e.g., a glass panel), for patterning the epoxy bisphenol A novolac resin layer into a desired shape for a mold, for improving the ability of the epoxy bisphenol A novolac resin to adhere to the support, for making the cured epoxy bisphenol A novolac resin less brittle or more resilient, and for planarizing a thick layer of uncured epoxy bisphenol A novolac resin.

The fabricated molds may be used to form spacers on a display. The mold is filled with a spacer material, brought into contact with a substrate (e.g., a faceplate of an FED), and the spacer material is allowed to cure into hardened spacers. After curing, the mold and substrate are separated leaving cured spacers attached to the substrate. Thereafter, the substrate and spacers may be dried and fired to further harden or cure the spacers.

Preferred materials for use as the spacer material are also disclosed below. Preferably, the spacer material is a liquid or gel that can be used to fill the apertures in a mold and that then cures into a hardened spacer. Preferred spacer materials comprise sodium silicate and potassium silicate. Other preferred materials comprise compositions comprising formamide, potassium silicate and sodium silicate.

Primary positive molds (fabricated using photolithography) may be used to form secondary negative molds. Such a secondary negative mold is preferably made by depositing a resilient material, such as latex, silicone, or plastic, over the primary positive mold so that the material conforms to the positive mold, allowing the material to cure, and then separating the cured resilient material from the positive mold. The resulting secondary negative mold can then be filled with a spacer material and placed in contact with a substrate so as to form spacers on the substrate.

Alignment of the mold and the substrate can be achieved by including an alignment template in the mold. One preferred method of achieving alignment is to provide some alignment marks near the border of a primary positive mold. A thin sheet of perforated metal (e.g., spring steel) that is flexible and resistant to permanent bending is then fabricated that replicates the alignment marks of the positive mold. The metal sheet is then positioned so that the alignment marks of the metal sheet are aligned with the alignment marks of the positive mold. Resilient material used for making the negative mold is then poured over the positive mold so that the resilient material encases the perforated portion of the metal sheet and so that the portion of the metal sheet including the alignment marks protrudes through the exterior of the resilient material. After curing, the resilient material is permanently bonded to the metal sheet. Thereafter, when the negative mold is used to apply spacers onto a substrate, the alignment marks of the metal sheet may be aligned with alignment marks on the substrate.

The molds and spacer materials constructed according to the invention are suitable for forming spacers on large flat panel displays. For example, spacers may be formed on displays with rectangular active areas measuring at least eight inches by ten inches.

Still other objects and advantages of the present invention will become readily apparent to those skilled in the art from the following detailed description wherein several embodiments are shown and described, simply by way of illustration of the best mode of the invention. As will be realized, the invention is capable of other and different embodiments, and its several details are capable of modifications in various respects, all without departing from the invention. Accordingly, the drawings and description are to be regarded as illustrative in nature, and not in a restrictive or limiting sense, with the scope of the application being indicated in the claims.

BRIEF DESCRIPTION OF THE FIGURES

For a fuller understanding of the nature and objects of the present invention, reference should be made to the following detailed description taken in connection with the accompanying drawings in which the same reference numerals are used to indicate the same or similar parts wherein.

DETAILED DESCRIPTION OF THE INVENTION

Figure 2:
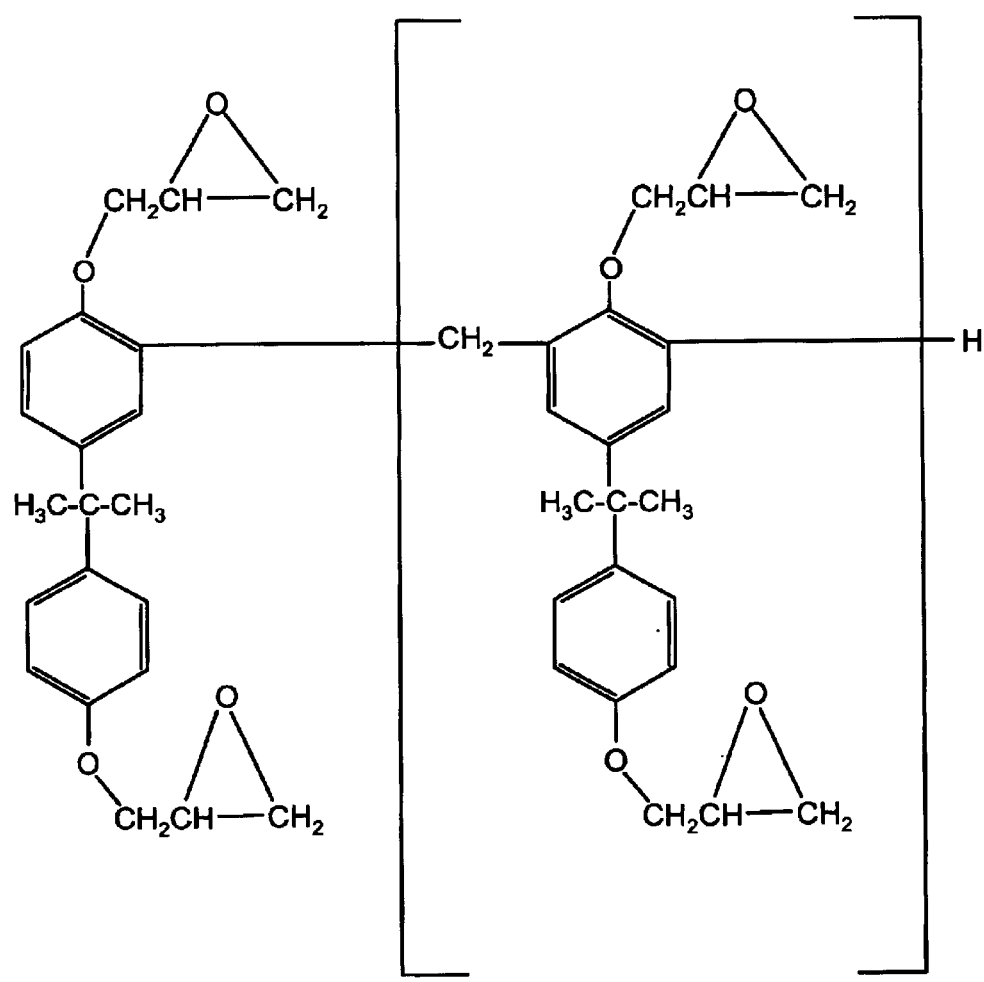
FIG. 2 shows the chemical structure of EPON® Resin SU-8.

In the present invention, molds are used to form spacers in flat panel displays. Thick film photolithographic materials are used to make the molds. A thick film photolithographic material, or photoresist, is a material that can be used to form features that are at least about 400 to about 500 $\mu$m thick using standard photolithographic techniques. Preferably, the thick film photolithographic material is an epoxy bisphenol A novolac resin. Epoxy bisphenol A novolac resins include, for example, EPON® Resin SU-2.5 (Shell Chemical), EPON® Resin SU-3 (Shell Chemical), and EPON® Resin SU-8 (Shell Chemical), and the like. Preferably, the epoxy bisphenol A novolac resin is EPON® Resin SU-8 (hereafter "SU-8"). SU-8 has the structure shown in FIG. 2. Polymerization of the monomer occurs at the terminal oxygen rings. SU-8 was originally developed for Micro Electro-Mechanical Systems (MEMS), and can form structures up to 1200 $\mu$m thick using contact printing (Lorenz et al, "SU-8: A Low-Cost Negative Resist For MEMS," *J. Micromech. Microeng.*, 7:121–124 (1997)).

After the molds have been formed, the molds are filled with a spacer material and then the spacer material is allowed to cure onto a portion of an FED so as to form spacers for the FED. Preferred compositions of the spacer material will be discussed below. Generally, the spacer material is preferably a liquid or gel (1) that may be used to fill apertures in the molds and (2) that hardens or cures to a relatively rigid material.

Figure 3A:
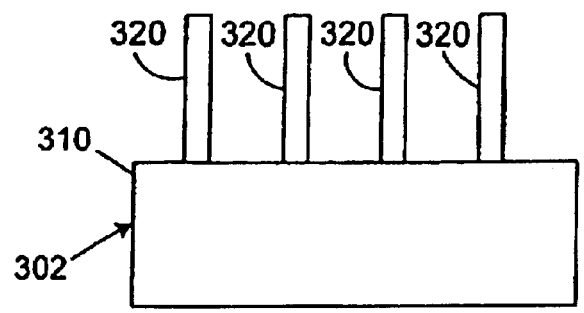
FIGS. 3A and 3B show side and top views, respectively, of a primary positive mold constructed according to the invention.
Figure 3B:
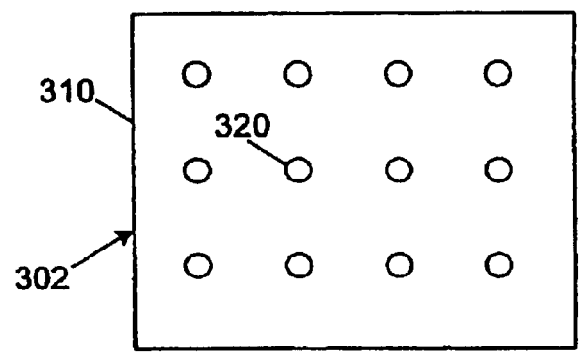

Prior to discussing certain aspects of the present invention in detail, the use of molds for forming spacers according to the invention will be briefly reviewed. FIGS. 3A through 3G illustrate how a primary positive mold may be used to form a secondary negative mold and how that negative mold may be used to form spacers on an FED. FIGS. 3A and 3B show side and top views, respectively, of a primary positive mold 302. Mold 302 includes a support 310 and a plurality of posts 320. As will be discussed in greater detail below, the posts are preferably formed by using conventional photolithography steps to pattern a layer of thick film photoresist material. As will also be discussed below, each of the posts 320 of positive mold 302 will be used to form a single spacer in an FED. Although mold 302 is illustrated as only including twelve posts 320, it will be appreciated that positive molds constructed according to the invention typically include thousands of posts, one post for every spacer on an FED. It will further be appreciated that, for convenience of illustration, FIG. 3A as well as the other figures are not drawn to scale. For example, each of the posts 320 is typically about 350–700 microns high and about 25 microns wide. The support 302 is normally several centimeters thick so that the mold can be easily handled. The support of a mold constructed according to the invention is typically rectangular and may be about ten inches by about twelve inches. The active area of the mold (i.e., the portion including the posts 320) may be about eight inches by ten inches for use with displays having rectangular active areas that are eight by ten inches.

Figure 3C:
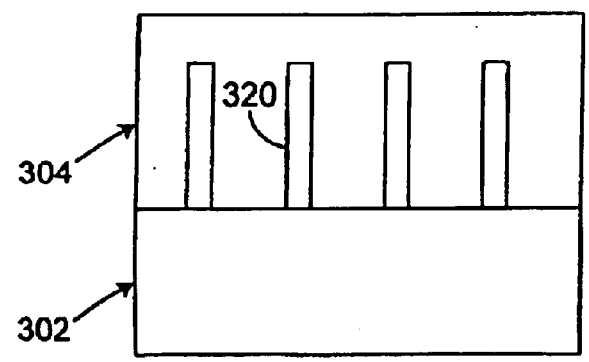
FIG. 3C shows the mold of FIG. 3A being used according to the invention to form a secondary negative mold.
Figure 3D:
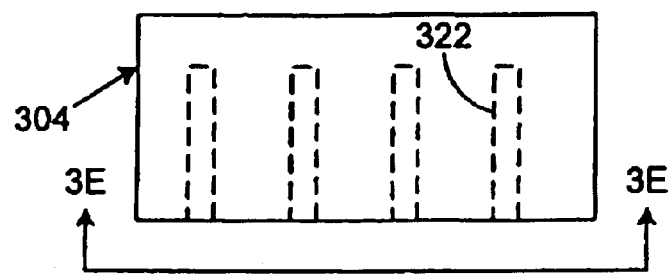
FIG. 3D shows the finished negative mold, the fabrication of which was illustrated in FIG. 3C.
Figure 3E:
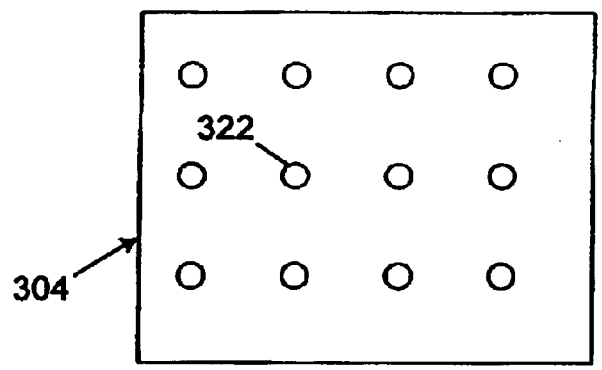
FIG. 3E shows a view of the negative mold taken in the direction of line 3E—3E as shown in FIG. 3D.

As shown in FIGS. 3C, 3D, and 3E, primary positive mold 302 may be used to form a secondary negative mold 304. Negative mold 304 is normally formed by depositing a material that is relatively flexible or resilient when cured, such as latex, silicone, or low-melting-point plastic, over primary mold 302 so that the material conforms to the positive mold as shown in FIG. 3C. One preferred material for forming negative mold 304 is a natural latex rubber mold-making material manufactured by B.F. Goodrich and sold under the name ARTCRAFT®. After curing, the negative mold 304 is separated from positive mold 302. FIG. 3D shows a side view of negative mold 304 after it has been separated from positive mold 302, and FIG. 3E shows a view of mold 304 taken in the direction indicated by line 3E—3E as shown in FIG. 3D. As shown in FIGS. 3D and 3E, negative mold 304 defines a plurality of apertures 322 corresponding to the posts 320 of positive mold 302. Regarding the scale of FIG. 3D, it will again be appreciated that the apertures 322 in mold 304 are typically about 350–700 microns high, and that the entire mold 304 is normally several centimeters thick so that the mold may be easily handled (i.e., the portion of the mold extending above the tops of apertures 322 is much larger than is indicated in the figure). It is normally advantageous to spray or apply a release agent (e.g., Krylon) to the primary positive mold 302 before depositing the material used to form mold 304 over mold 302. The release agent facilitates separation of the positive mold 302 and the cured negative mold 304.

Figure 1:
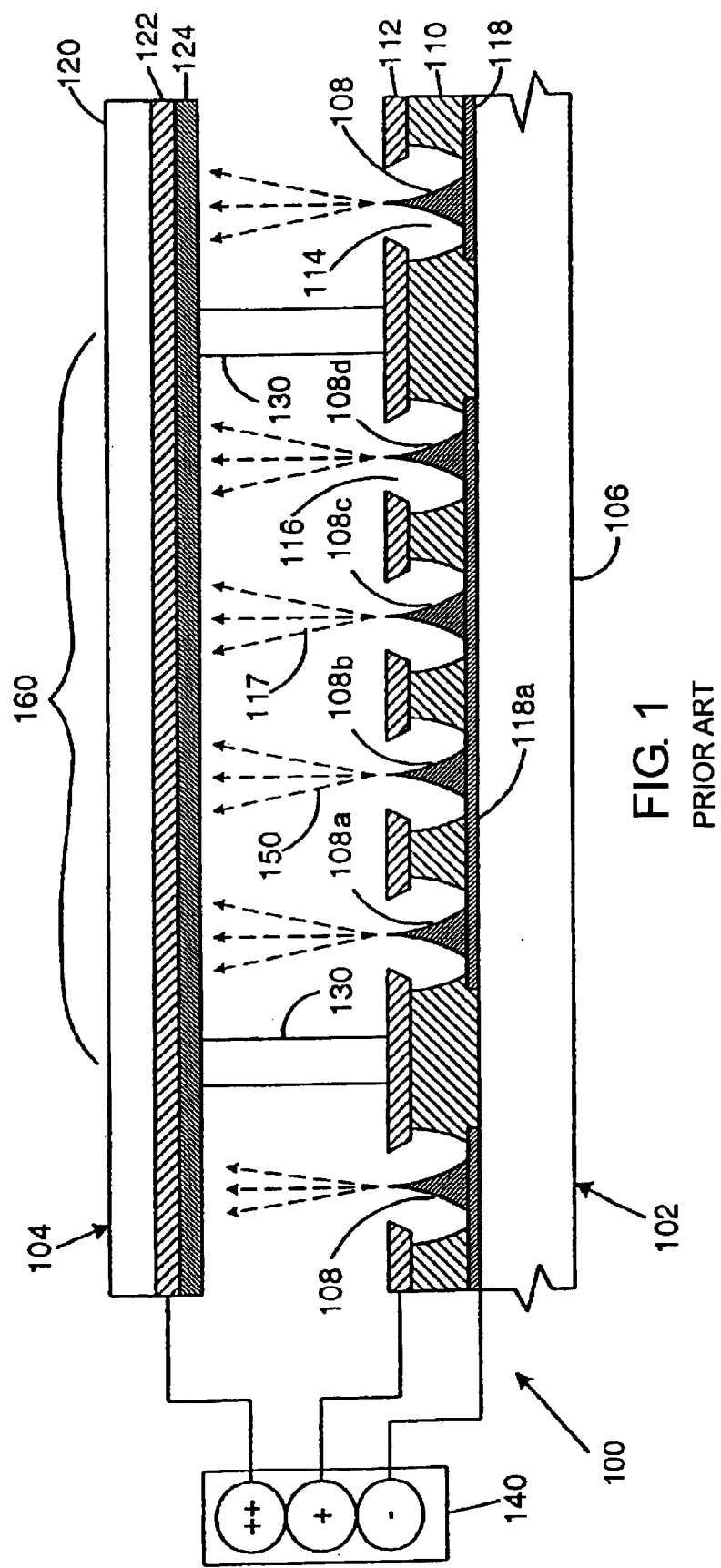
FIG. 1 is a cross section of a portion of a prior art field emission display (FED).
Figure 3F:
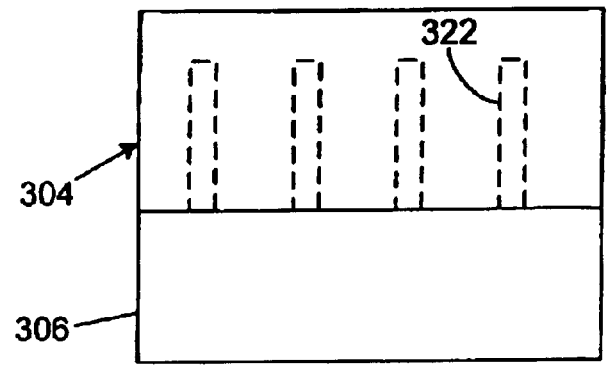
FIG. 3F shows the negative mold of FIG. 3D being used to apply spacers to a substrate.
Figure 3G:
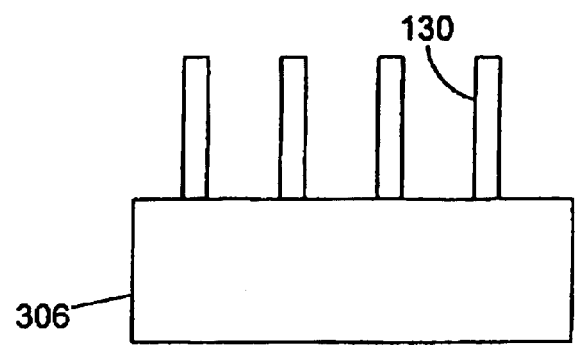
FIG. 3G shows the substrate of FIG. 3F after the spacers have cured and the negative mold has been separated from the substrate.

Negative mold 304 may then be used for forming spacers on an FED as illustrated in FIGS. 3F and 3G. Initially, the apertures 322 of negative mold 304 are filled with a spacer material and then the mold 304 is placed in contact with a substrate 306 (e.g., faceplate 104 or baseplate 102 of the type shown in FIG. 1) as shown in FIG. 3F. After the spacer material in apertures 322 has cured, the mold 304 and substrate 306 may be separated thereby leaving a plurality of cured spacers 130 attached to substrate 306 as shown in FIG. 3G. Each of the spacers 130 corresponds to one of the posts 320 of positive mold 302. After separation, the substrate 306 and spacers 130 would normally be air dried and then fired to further cure and harden the spacers 130.

It will be appreciated that the negative mold 304 is reusable and may accordingly be used to form spacers on many substrates. Similarly, the positive mold 302 is also reusable and may be used to form many negative molds.

Figure 3H:
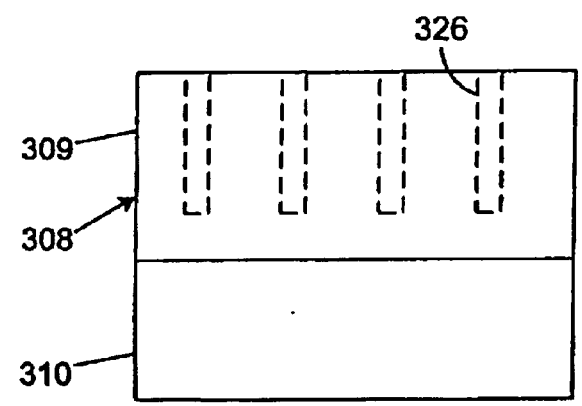
FIGS. 3H and 3I show side and top views, respectively, of a primary negative mold constructed according to the invention.
Figure 3I:
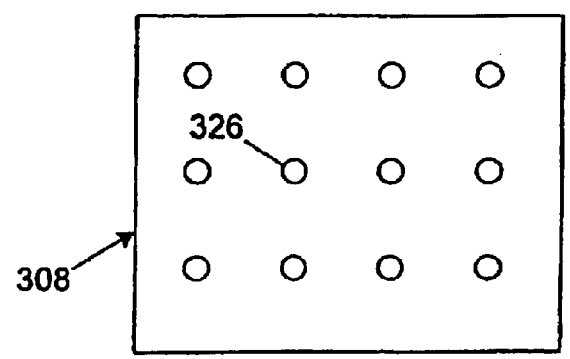
Figure 3J:
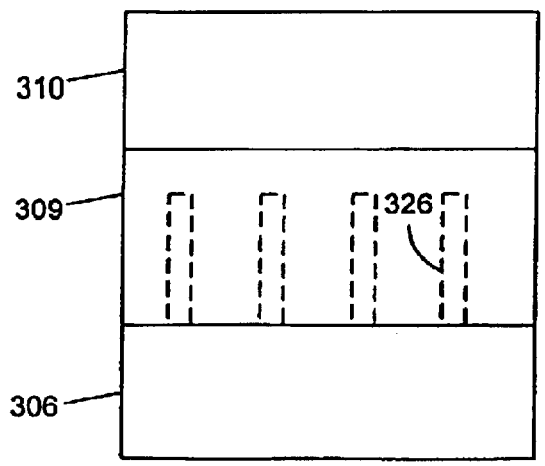
FIG. 3J shows the mold of FIGS. 3H and 3I being used to apply spacers to a substrate.
Figure 3K:
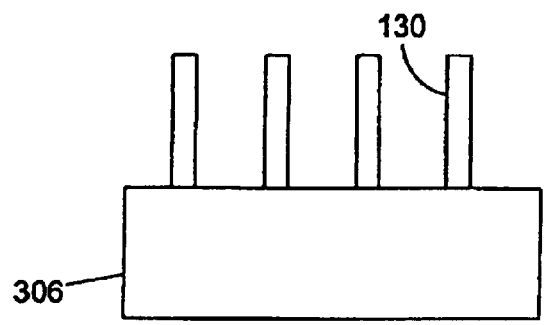
FIG. 3K shows the substrate of FIG. 3J after the spacers have cured and the negative mold has been separated from the substrate.

As discussed above, the posts 320 of positive mold 302 are preferably made by patterning a layer of thick film photoresist material. Instead of patterning thick film photoresist material to form posts, it is also possible to pattern a layer of thick film photoresist material to form apertures and thereby use photoresist material to form a negative mold. FIGS. 3H and 3I show side and top views, respectively, of such a negative mold 308. Negative mold 308 includes a support 310 (typically several centimeters thick) and a layer of thick film photoresist 309 that has been patterned so that layer 309 defines a plurality of apertures 326. Layer 309 is typically about 400 to 800 microns thick and the apertures 326 are typically about 350–700 microns high. The apertures 326 of negative mold 308 may be filled with a spacer material and then the mold 308 may be placed in contact with a substrate 306 (or another portion of an FED) as shown in FIG. 3J. After the spacer material has cured, the negative mold 308 and the substrate 306 may be separated thereby leaving a plurality of cured spacers 130 attached to the substrate as shown in FIG. 3K. Each of the spacers 130 corresponds to one of the apertures 326 of negative mold 308. It will be appreciated that negative mold 308 is also reusable and may be used to apply spacers to numerous FEDs.

Although negative molds (such as mold 308) made using photolithography are useful, it is currently preferred to use secondary negative molds (such as mold 304) that are made by depositing a material over a positive mold (such as mold 302) that conforms to the positive mold and then cures to a resilient material. This is because negative molds made using photolithography (such as mold 308) tend to be rigid or brittle and it is more convenient to use a resilient mold such as mold 304.

Now that a brief background on the use of molds for forming spacers in FEDs has been provided, the spacer material that is used to fill the apertures in the molds and that cures or hardens into the spacers for an FED will be discussed. While any spacer material known in the art can be used in the embodiments of the present invention described herein, the spacer material is preferably the novel sol gel of the present invention. A sol gel is a high-density, non-porous structure usually composed of silicates. "High-density" preferably means that the sol gel is about 80 to about 90% $SiO_2$. The common starting materials for forming the sol gels of the present invention are silicates in an aqueous or alcohol solution. The basic starting material is preferably an alkali silicate solution. Alkali silicate solutions include, for example, Kasil 2130 (PQ Corp.) or N-silicate (PQ Corp.).

Silicate solutions are clear and slightly viscous with a pH typically over 11. Formamide ($HCONH_2$), acting as a weak acid and an initiator, converts the alkali hydroxide into a formate while lowering the overall pH of the solution. At a certain critical pH, the silica present as hydrated micelles several nanometers in diameter begin to contact each other and react. Hydroxyl groups on the surface of the micelles are eliminated via hydrolysis, leaving a network of three-dimensionally connected chains of silica. Using formamide as an initiator is described by Ulrich, *Chemtech*, pages 242–249 (April 1988). Besides formamide, other initiators known in the art, such as propylene carbonate can be used.

The three-dimensional silica network along with the water in the original solution comprise a gel. Depending on the degree of connectivity, the gel can be soft with long strands of polymer or hard with short frequently branched strands of polymer. The more frequently connected the polymer strands the more water is eliminated from the bulk of the gel.

When a large amount of formamide is used (e.g., more than one part formamide to one part silica), gelation begins immediately upon mixing, and within minutes a soft gel is formed. A short time later the gel shrinks, turns cloudy and eliminates water from the bulk. Within one half hour after mixing, the gel is a hard white solid. Most of the original liquid in the silicate solution is eliminated from the interior volume of the gel.

When a slightly smaller amount of formamide is used (e.g., less than about one part formamide to one part silica), it leads to a soft gel that eliminates a minor amount of water and dries without cracking. In formamide:silica ratios of less than 1:1 to 1:10, a gel is formed which is soft, clear and only slightly moist to touch. These gels may be air dried, then heat treated to over 500° C. without problems. Weight loss experiments indicate nearly all detectable water is driven off, the unreacted formamide is decomposed as $NH_4$ and $CO_2$, and the alkali formate byproducts are converted to oxalates.

1 part formamide in 20 or more parts Kasil lead to gels which require several days to cure at room temperature. Clear soft and dry to touch, these gels collapse when dried and release all detectable water when baked from 480–500° C.

The best formulation for preparing Kasil-based sol gels is ¼ to 1 part formamide to 1 part silica, preferably about ¼ part formamide to 1 part silica. The gelation time is several hours at room temperature. During gelation, the silica network pulls together, and shrinks away from the confines of the mold, eliminating water. As a supernatant liquid, this water lubricates the void between the gel surface and the mold allowing easy separation of the two parts.

When propylene carbonate is used as the initiator, it works about ten times faster than formamide. The gels of the present invention can be cast in about six minutes at room temperature when using about 12 grams of silicate to about 1 to 1½ grams of propylene carbonate.

In any of the embodiments of the present invention, drying of the spacers is preferably accomplished in two stages, an air dry which removes a large portion of water, and a firing that may ultimately reach 500° C. A preferred drying rate is described in Example 3.

Drying the gel in air leads to a collapse of the hollow pores which were filled with and supported by water. This volume loss can be related to the degree of connectivity. Simple drying at ambient temperatures will not in general make a solid compact body.

The sol gel is normally fired to create a dense structure. Firing at a temperature of 150–200° C. is required to decompose any unreacted formamide and loss experiments carried out on the reactants indicate an oxalate reaction occurs.

While ceramic bodies composed of discrete micron sized particles require firing at temperatures where the viscosity is about 8 to 8.8 to achieve a dense non-porous structure, sol gels begin to compact and densify at a viscosity of about 11. The densification of gels is describe in *Ultrastructure Processing of Ceramics, Glasses, and Composites*, Hench and Ulrich, Eds., Wiley-Interscience Publication, pages 76–87, the disclosure of which is incorporated by reference herein in its entirety.

A formulation of a sol gel containing 6 parts N-Silicate (sodium silicate) to 10 parts Kasil (potassium silicate) to 0.5 parts Formamide began to densify at 520° C. Larger proportions of sodium silicate will lower the densification temperature.

Densification temperatures of compositions containing varying amounts of $Na_2O$, $K_2O$ and $SiO_2$ are shown in Table 1.

The densified material formed two phases, one phase was a glassy material containing mostly silica, potassium and sodium, the other phase was in the form of long needle-like crystals containing sodium and oxygen, as measured by LDS. In cross sections of samples run at 480° C. and 500° C., the crystals were present in the pores of the dried gel. In the 520° C. run, the crystals were incorporated into the silica rich matrix. At 540° C., the sol gel become glassy, as evidenced by brittle fracture lines when the bulk gel was split for a cross sectional view.

Differential scanning calorimetry revealed two peaks in sodium-potassium silicate glasses, the first peak occurred for all compositions at a potassium:sodium silica ratio of about 10:6 to about 10:10 at 450° C. A second peak roughly 20° C. higher shifted lower in temperature as the sodium content was raised. The first peak is narrow and fairly deep indicating some sort of crystallization. It is near the predicated sintering/compaction temperature. Water in the glass precursor is responsible for dropping the sinter temperature to the 450° C. region, normally for a dry glass of this composition the sinter temperature is 100° C. higher. The reaction should be irreversible, leading to a glass that sinters and compacts at one temperature then becomes stable afterwards to a higher temperature. This property is engineerable based on the water content of the sol-gel and the degree of ripening.

The spacers can have their surface resistivity adjusted by including a semi-conductive material in or on the spacer. Such semi-conductive materials include, for example, tin oxide, lead oxide, zinc oxide and/or titanium oxide.

A major difficulty in filling the apertures of the molds of the present invention with the sol gels of the present invention is the $CO_2$ reaction that occurs on exposure of the silicates in the sol gels to air. $CO_2$ diffuses into the surface where it forms a weak acid, in turn reacting with the alkaline solution. This initiates a hydrolysis reaction that forms a skin over the top of the solution with a film of silica. The silica prevents the liquid from wetting the surface. One way to prevent the skin formation is to perform the mold filling operations described herein in an inert gas, such as argon.

Preferably, each spacer in the present invention can hold about 0.05 pounds or more of pressure, more preferably about 0.07 pounds or more of pressure. Accordingly, about 422 spacers per square inch are preferably used in a flat panel display. Since there are generally about 10,000 spacer bonding sites per square inch in a flat panel display, the yield (i.e., the number of spacers that bond to the substrate) does not have to be particularly high in order to achieve good results.

The spacers and molds described herein can be used in flat panel displays in field emission displays or plasma displays. In field emission display applications, the spacers are generally about 350–700 $\mu$m tall. In plasma display applications, the spacers are generally about 80–100 $\mu$m tall.

Figure 4:
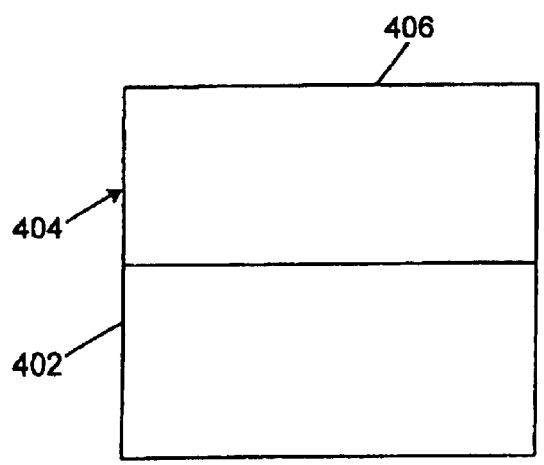
FIG. 4 shows a thick film of photoresist that has been applied according to the invention to a support.

Now that the spacer material has been discussed, the use of thick film photoresist (e.g., an epoxy bisphenol A novolac resin) for forming the molds will be discussed. An initial step in the formation of such a mold (e.g., primary positive mold 302 as shown in FIG. 3A or negative mold 308 as shown in FIG. 3H) is to form a thick layer (e.g., 130–775 $\mu$m) of photoresist material over a support. FIG. 4 illustrates a thick layer of photoresist material 404 (e.g., about 700 microns) that has been deposited over a support 402 (support 402 is typically several centimeters thick). Layers 402 and 404 are each typically rectangular and measure several inches in length and width (e.g., eight inches by ten inches). The thick layer of photoresist material 404 can be formed in several ways, including, for example, by spin coating, dip coating and meniscus coating. Methods for spin coating, dip coating and meniscus coating are known in the art. Preferably, the photoresist material 404 is an epoxy bisphenol A novolac resin, more preferably SU-2.5, SU-3 or SU-8, most preferably SU-8. The support 402 can be any support known in the art, including, for example, a glass panel. In a preferred embodiment, the support is covered with a first thin layer (e.g., 30–75 μm) of photoresist material, flood exposed and post-exposure baked to create a flat, well-bonded base layer on the support. Thereafter, a second thick layer (e.g., 100–700 μm) of photoresist material is applied, exposed using a photomask, and developed to form the desired pattern.

A novel method for forming layer 404 is by powder coating. In one example of powder coating, dry SU-8 powder is applied to the support 402 and baked at temperatures required for reflow. Specifically, solid SU-8 is mixed with a solvent, preferably a general organic solvent, such as ethyl lactate, and a photoinitiator. Any photoinitiator known in the art can be used, such as, for example, Cyracure 6974 photoinitiator, Cyracure 6990 photoinitiator, and the like. The components are thoroughly mixed until the dry SU-8 powder dissolves. Thereafter, the solvent is removed by heating, and the SU-8 powder is finely ground. Conventional powder coating techniques are then used to apply a uniform thickness of dry powder to the support. When heated to about 120–130° C., the SU-8 powder melts, reflows, and planarizes during reflow due to its high surface tension to form, for example, a layer such as layer 404 shown in FIG. 4.

Meniscus coating can also be used to form a layer 404 of thick film photoresist material that is about 400–450 μm thick. Preferably, the thick film photoresist material is an epoxy bisphenol A novolac resin, more preferably SU-8. This is done by using a meniscus coater to form a series of about 80–200 μm thick coatings, one on top of another. Preferably, after each meniscus coating is deposited, the support and coatings are baked (e.g., at about 95° C. for about 20 minutes, then at about 110° C. for about 25 minutes) before the next meniscus coating is deposited. This method removes all of the solvents from the thick film photoresist material. The thickness increment is limited by the solids content of the thick film photoresist material, which is in turn limited by the specific pumping equipment of the meniscus coater.

Exemplary methods for forming layer 404 are described in more detail herein. A practical composition comprising SU-8 was described in several papers (e.g., Lorenz et al, "EPON SU-8: A Low Cost Negative Resist For MEMS," *Sensors & Activators*, A64:33–39 (1998)), the disclosure of which is incorporated by reference herein in its entirety), although a more preferred composition is described herein. Preferably, the composition comprises about 200–600 parts by weight solvent (e.g., ethyl lactate thinner), about 200–600 parts by weight SU-8, and about 1–100 parts by weight photoinitiator (e.g., Cyracure 6974 or 6990 photoinitiator). More preferably, the composition comprises about 300–500 parts by weight solvent (e.g., ethyl lactate thinner), about 300–500 parts by weight SU-8, and about 10–70 parts by weight photoinitiator (e.g., Cyracure 6974 or 6990 photoinitiator). Most preferably, the composition comprises about 400 parts by weight solvent (e.g., ethyl lactate thinner), about 400 parts by weight SU-8, and about 40 parts by weight photoinitiator (e.g., Cyracure 6974 or 6990 photoinitiator).

After the solvent and photoinitiator are mixed together, SU-8 is added. After all the SU-8 dissolves, ultrasonic agitation can be used to de-gas the material. A meniscus coater is then preferably used to successively deposit several layers of the material over a substrate 402 to form a thick layer 404 of photolithographic material. The support speed in the meniscus coater can be about 0.1–1.0 cm/second, preferably about 0.55 cm/second. Any soft-bake temperatures and time that slowly drive off the solvent can be used, such as, for example, about 95° C. for 30 minutes followed by 130° C. for 30 minutes.

After layer 404 has been formed (e.g., by meniscus coating, powder coating, or spin coating), the upper or "contact" surface 406 of layer 404 is sometimes "wavy" or non-planar. As shown in FIG. 4, contact surface 406 is the surface of layer 404 that is distal from the support 402. With reference to FIGS. 3H and 3J it can be appreciated that it is advantageous for the contact surface 406 (as shown in FIG. 4) to be planar, or as planar as possible. If the surface of the photoresist layer that contacts the substrate 306 during the molding process is not planar, the spacer material in apertures 326 may not bond well to the substrate. Developed SU-8 is brittle. However, unexposed SU-8 will cold flow under pressure, when layer 404 is formed from SU-8. So, planarization of the contact surface 406 of the undeveloped layer 406 may be achieved by using a press (i.e., by using a platen of the press to apply pressure to the contact surface 406). Prior to applying the platen to contact surface 406, it may be advantageous to apply a release agent to the contact surface 406 or the platen to prevent the platen from bonding to the contact surface 406. Preferably, the release agent is Krylon industrial mold release (Borden Co.). The release agent can be sprayed on from an aerosol can. Applying the release agent to the platen and allowing the organic solvents to escape is the preferred application method. The support is placed in the press and force is applied to the panel to cold flow the SU-8. Several microns of waviness may be removed from contact surface 406 in this manner. These methods produce a SU-8 layer over a support, having a relatively planar contact surface 406.

Since developed SU-8 is brittle, when negative mold 308 is used to apply spacers to a substrate (as discussed above in connection with FIGS. 3H, 3I, 3J, and 3K), it is advantageous for the contact surface 406 (as shown in FIG. 4) of the mold to be as planar as possible. However, when a negative mold made from latex, or another resilient material, (e.g., such as negative mold 304) is used to apply spacers to the substrate, it is less important for the contact surface to be planar. This is because pressure can be applied to hold the mold and substrate tightly together while the spacer material is curing. Such pressure can temporarily "smooth out" or planarize the contact surface insuring that the spacers contact and bond to the substrate.

One problem with thick film photoresists is that they are sometimes characterized by poor adhesion to a support. It can therefore be advantageous to prime the support 402 prior to forming the thick film photoresist layer 404 to improve adhesion between the support 402 and the thick film photoresist layer 404. One reason for desiring good adhesion between the photoresist layer and the support can be illustrated with reference to FIGS. 3A through 3D. As shown in FIG. 3A, the positive mold 302 comprises a plurality of photoresist posts 320 disposed over, and attached to, support 310. The negative secondary mold 304 is formed by depositing a compound over positive mold 302, allowing the compound to cure, and then separating the positive mold 302 from the negative mold 304. If the posts 320 do not strongly adhere to the support 310, the posts 320 may break off of the support 310 when the cured negative mold 304 is separated from the positive mold 302 thereby damaging the positive mold. Therefore, to preserve the integrity of the positive mold 302, and to allow the positive mold 302 to be used to fabricate a large number of secondary negative molds, it is desirable to provide good adhesion between the photoresist posts 320 and the support 302.

Conventional primers that have been used to improve adhesion of photoresist materials include silanes, such as HMDS, which have silanol groups at one end and organic methyl groups at the other. These priming materials generally work for novolac resins, but are generally ineffective for SU-8 because SU-8 is an epoxy, and the methyl groups do not participate in bonding. As described below in Example 1, making the support 402 as polar as possible and terminating it in hydroxyl groups or amine groups provides the best possible surface for wetting and adhesion to the photolithographic material. For example, triethanol amine and/or ethylene glycol can be applied to the upper surface of support 402 as a priming agent before the photolithographic material is deposited onto the upper surface of the support 402. Adhesion of the layer 404 to the support 402 can be greatly improved by, for example, mixing triethanol amine as a 1% solution in IPA, coating the substrate with the solution for three minutes, and then rinsing off the solution.

Figure 5:
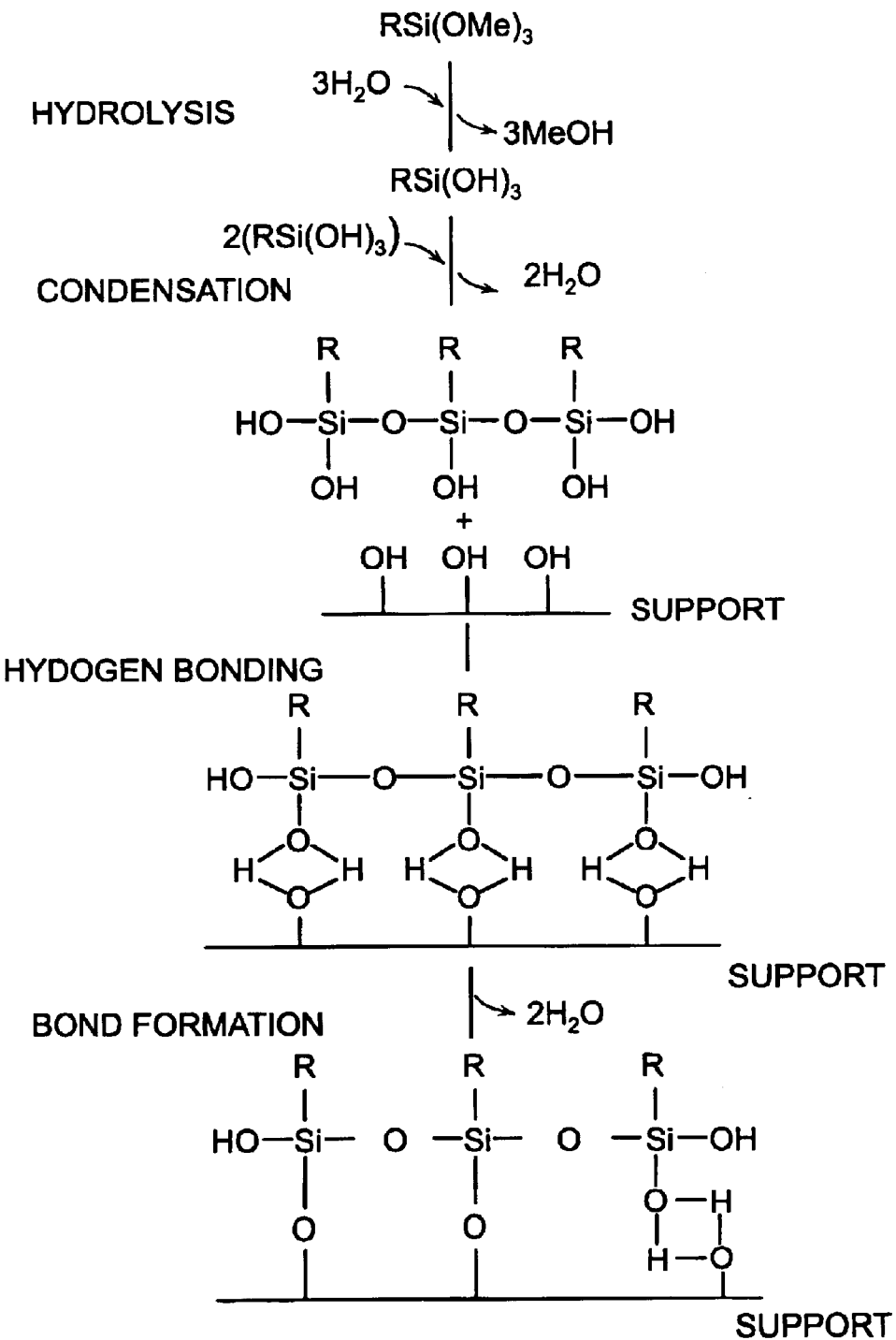
FIG. 5 shows the general reaction scheme for bonding a silicate to a glass surface.

Alternatively, a silane bonding agent can be used to improve adhesion between the support 402 and the thick film photoresist layer 404. A silane bonding agent preferably comprises silane, cyclohexane and an epoxy group, such as 2(3,4-epoxycyclohexyl)ethyltrimethoxysilane (manufactured by Gelest). This material, used as a primer from a deionized water/alcohol bath at a pH of 4.5–5.5, forms a monomolecular film that hydrolyzes to the support 402 via the silane groups and permanently bonds to the layer 404 with a ring opening polymerization reaction. The general reaction scheme for bonding a silane to a glass surface is shown in FIG. 5.

After a thick film layer of photoresist has been formed over a support, conventional photolithographic processing (e.g., exposure followed by developing or etching) can be used according to the invention to pattern the layer 404 of photoresist material and thereby convert layer 404 into a mold (e.g., such as positive mold 302 as shown in FIG. 3A or as negative mold 308 as shown in FIG. 3H). Exposure of the photoresist material can be by broadband ultraviolet light (preferably about 365–400 nm) or by contact printing. Exposure can be performed until a latent image is formed. A post-exposure bake can be done at 95° C. for 8–30 minutes, depending on the thickness of the SU-8, followed by 25 minutes at 115° C. Use of the two temperatures is desirable for reducing distortion that occurs during post exposure bake. The 95° C. firing softens and melts the unexposed SU-8. The 115° C. firing develops full adhesion between the SU-8 and support.

PGMEA (propylene glycol monomethyl ether acetate) can be used to develop the exposed photoresist material. For example, two baths of PGMEA can be used, where the first bath is used to remove all of the undeveloped SU-8, and the second bath is used as a rinse to remove the SU-8-loaded developer from the first bath. A final rinse in IPA can then be performed. Going from PGMEA developer to IPA without the intermediate rinse in clean PGMEA results in scumming, as the dissolved resist coagulates in the incompatible EPA solvent.

A post develop firing may also be performed to increase adhesion and dry out any remaining developer or solvent (e.g., about 85–95° C. for about 10–20 minutes).

It has been discovered that exposed and developed SU-8 is a hard and brittle plastic that cracks under stress and is not particularly compliant. The brittle nature of the cured SU-8 can impose restrictions on the flatness of an SU-8 mold's contact surface. For example, if SU-8 is used as the photolithographic layer 309 in negative mold 308 (as shown in FIG. 3H), the upper surface of the layer 309 must be flat (or planar). If this surface is not flat, then the brittle nature of the cured SU-8 will prevent portions of the negative mold 308 from contacting the substrate 306 when the mold and substrate are placed in contact as shown in FIG. 3J. That is, waviness in the contact surface of the SU-8 mold, can cause areas of the mold to drop out of contact with the substrate, such that the spacers will not adhere to the substrate, which leaves bare patches on the substrate. Generally applying pressure up to 14 psi will not make the SU-8 mold conform flat against the substrate.

Accordingly, it is desired to modify the properties of cured SU-8 so that the mold can better contact the substrate. As shown in Example 2, it has been unexpectedly discovered that crosslinking agents, such as polyols, can be used to successfully modify the properties of cured SU-8. For example, polyols added to uncured, undeveloped SU-8 increase flexibility, photospeed, and adhesive strength. The polyol is preferably a triol or a diol, more preferably a diol. Preferred diols include propanediol, hexanediol, ethylene glycol and the like. The base ratio of SU-8 terminal groups to diol terminal groups is preferably 1.5 to 1. The quantity of the diol can be increased or decreased, depending on the desired properties of the resin.

Without intending to be bound by any theory of the invention, the property of the diols that make them an effective additive is the increase in crosslinking speed that occurs with their use. For best adhesion, the post-exposure bake (PEB) temperature of the SU-8 resist was about 115° C. to 125° C. This exceeds the melting point of the unexposed SU-8 resin, which is 83° C. This creates a problem in properly baking microstructures that do not bend or otherwise deform under the stress of the unexposed resist expanding and melting. The diols rapidly crosslink the exposed resist during the initial part of the bake, making it strong enough to prevent warping under stress. The increase in viscosity during PEB also affects the resolution of the resist. A fast rise in viscosity prevents diffusion of the acid groups from the exposed to the unexposed regions, which can lead to blurring. This is seen in developing small holes and bars. With base resin, the diffusion of the acid generator into the unexposed regions creates a viscous layer around the features which does not develop away. This leads to stringers, at best, and filled holes and gaps, at worst. The polyol, such as propanediol and hexanediol, appears to have rapidly allowed the SU-8 to polymerize. This would have the effect of blocking diffusion quickly so that blurring does not occur.

It has also been discovered that developed SU-8 can be further treated so that it reacts better with the spacer material that is used to fill apertures in the molds (e.g., apertures 326 in cured photoresist layer 309 of negative mold 308 as shown in FIG. 3H). After development, the SU-8 layer is hydrophobic, which means that the liquid spacer material added thereto may bead up rather than conform to the apertures in the layer. Thus, it has been discovered that an oxygen glow discharge can be used to treat the surface of the hydrophobic SU-8. After such treatment, the surface of the SU-8 mold will be hydrophilic, as proven by water drop contact angle measurements. Alternatively, UV based ozone treatments can be used to treat the surface of the mold to make it hydrophilic. Chemical treatments, such as surfactants, may also be used to change the degree of surface polarity. Making the mold hydrophilic allows for better conformation of the liquid spacer material therein.

Preferred spacer materials for use with the invention and preferred methods of treating photoresist according to the invention have been discussed above. Additional factors concerning how to form spacers with molds according to the invention will now be discussed.

Figure 6A:
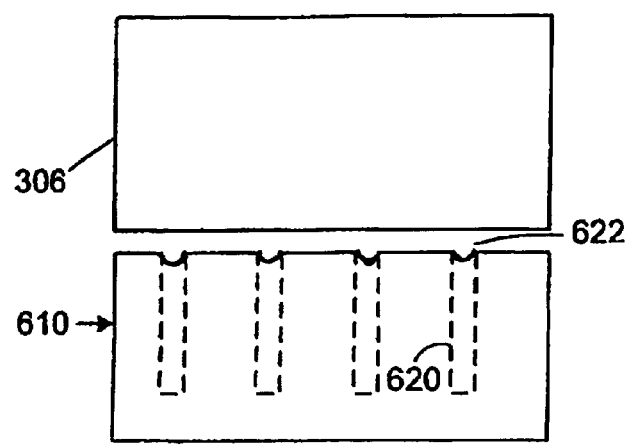
FIG. 6A shows a negative mold disposed adjacent to a substrate to which spacers will be attached in which the apertures of the mold have been filled to overflowing with spacer material according to the invention.
Figure 6B:
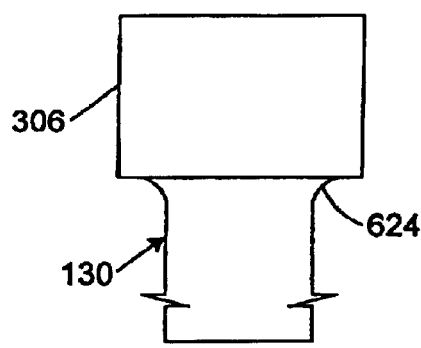
FIG. 6B shows a magnified view of one of the spacers that has been attached to the substrate.

FIG. 6A shows a small portion of a negative mold 610 constructed according to the invention. It will be appreciated that negative mold 610 could be for example of the type shown at 304 in FIG. 3D or of the type shown at 308 in FIG. 3H. The apertures 620 of negative mold 610 have been filled with a spacer material of the type discussed above (e.g., one of the above discussed sol gels). As shown, the apertures 620 have been filled to overflowing so that a small amount of spacer material 622 extends over each aperture 620. FIG. 6A also shows a substrate 306 (e.g., a faceplate of an FED) positioned adjacent the mold 610. Spacers are formed on the substrate by bringing the substrate 306 and mold 610 into contact and allowing the spacer material to cure. The substrate 306 and mold 610 are preferably left in contact until gelation or. curing of the spacer material occurs. The mold 610 and substrate 306 may then be peeled apart, at which time the hardened spacers will be bonded to the substrate 306. FIG. 6B shows a magnified view of a portion of one of the spacers 130 that are attached to substrate 306 after the mold 610 and substrate 306 are separated. As shown, the base of spacer 130 includes a portion 624 that is "flared out" where the spacer 130 contacts the substrate 306. It is advantageous for the spacers 130 to include such flared out bases since they increase the strength of the bond between the spacers and the substrate. It has been found that filling the apertures 620 of the mold so that the spacer material overflows as shown at 622 in FIG. 6A advantageously increases the likelihood that spacers will be formed with flared out bases 624. One disadvantage of filling the apertures so the spacer material overflows as shown at 622 is that it tends to form unwanted residues of hardened spacer material on the substrate.

Figure 6C:
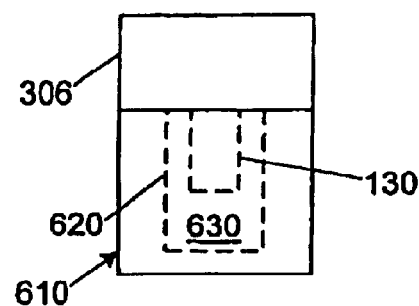
FIG. 6C shows a magnified view of one of the apertures in the mold of FIG. 6A while the spacer material is curing and expelling liquid.

FIG. 6C shows a magnified view of one of the apertures 620 of the mold 610. When sol gels of the type discussed above are used to fill the apertures 620 of the mold, the spacer material cures into a hardened or gelled portion 130 and an expelled liquid 630. Also, as the spacer material cures, the hardened portion 130 tends to shrink and to bond or attach itself to substrate 306. As the hardened portion 130 shrinks, the expelled liquid 630 tends to fill the remainder of the aperture 620 so that the liquid separates the hardened portion 130 from the surface of the mold 610. When the substrate 612 is removed from the mold 610, the expelled liquid 630 acts as a lubricator and facilitates separation of the substrate 306 and the mold 610. The liquid 630 tends to prevent the cured spacer material 130 from breaking off of substrate 306 or remaining attached to mold 620.

Figure 7A:
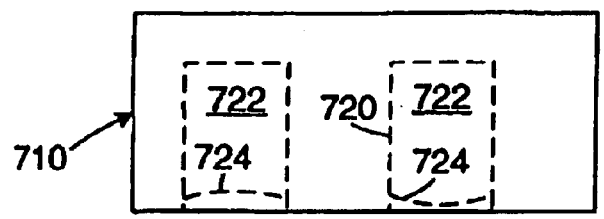
FIG. 7A shows one method according to the invention of filling apertures in a mold so that the spacer material does not overflow the apertures.

FIG. 7A illustrates an alternative method according to the invention for forming spacers. FIG. 7A shows a small portion of a negative mold 710 constructed according to the invention. Mold 710 defines apertures 720 that have been filled with a spacer material 722. Rather than filling the apertures to overflowing (as shown in FIG. 6A, the apertures have been filled so that a meniscus 724 of the spacer material 722 is recessed from the end of the aperture 720. Application of pressure to the mold 710 causes the meniscus 724 of the liquid spacer material to contact the surface of the substrate to which the spacers are to be attached. Preferably, pressure is applied until all the spacers have hardened and attached to the substrate. This method of forming spacers is particularly preferred when the mold is flexible, such as when the mold is made of latex or silicone. One advantage of filling apertures of the mold with spacer material so that the meniscus of spacer material is recessed (as shown in FIG. 7A) is that it tends to eliminate the unwanted residue that is sometimes formed when the apertures are filled to overflowing (as shown in FIG. 6A).

Figure 7B:
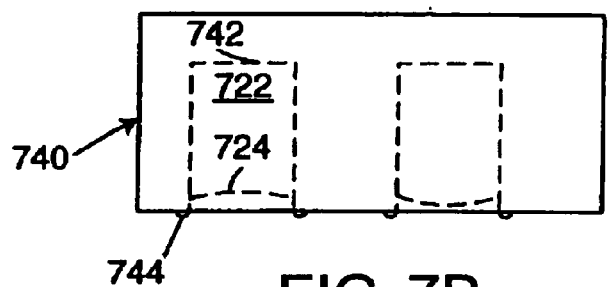
FIG. 7B shows another mold constructed according to the invention that includes a lip around the end of each aperture.

FIG. 7B shows an embodiment of a small portion of another negative mold 740 constructed according to the invention in which the end of each aperture 742 is surrounded by a lip or protrusion 744. Such a lip or protrusion 744 around the apertures 742 allows additional liquid spacer material to accumulate at the intersection of the substrate and the mold, permitting each spacer to be formed with a uniformly rounded or flared base 624, as described herein and shown for example in FIG. 6B.

Molds such as mold 740 can be formed by applying and imaging successive layers of photoresist (e.g., SU-8). For example, a positive mold for forming negative mold 740 may be constructed by applying, imaging, developing, and curing a first layer of photoresist material to define a plurality of shallow trenches. These trenches in the positive mold will later correspond to the lips 744 in the negative mold. Then a second layer of photoresist may be applied over the first layer and then imaged, developed, and cured to define a plurality of posts, each of the posts being surrounded by the previously formed trenches. The posts correspond to the apertures 742 in mold 740. Such a positive mold may then be used to form negative molds such as mold 740.

As an example of the above methods used in development work, liquid spacer material (e.g., silicate solution) was filled into all the apertures of a negative mold constructed according to the invention such that an excess of the spacer material protruded from the mold apertures to a depth of $\frac{1}{16}$ to $\frac{3}{32}$ of an inch. The wet mold was placed in a vacuum chamber and a moderate vacuum was pulled on it, whereby the air bubbles were removed from the mold volume, and, at the same time, the solution was degassed. The vacuum prevents the above-discussed "skinning over" effect. After the solution was fully degassed and the holes filled, the spacer material-filled mold was removed from the vacuum chamber and excess spacer material was squeezed off. An excess of spacer material (e.g., silicate solution) is preferably used to prevent the skin that forms on the spacer material (e.g., silicate) during vacuum exposure from covering the mold openings and trapping the air bubbles. Degassing the spacer material solution has the unexpected effect of delaying the gelation time. This is mainly due to the loss of $CO_2$ incorporated in the solution during mixing.

In a second implementation, the mold was placed in vacuum chamber in a vertical position (i.e., in a position that is rotated clockwise ninety degrees from the orientation shown in FIG. 6A about an axis perpendicular to the plane of the page in FIG. 6A). A high vacuum was drawn on the chamber. A spacer material (e.g., silicate solution) was introduced into the chamber, and the spacer material was drawn into the mold holes by surface tension/capillary action. Due to its viscosity, the spacer material may not be drawn into small features. After allowing the spacer material (e.g., silicate solution) to wet and flow as well as possible, the spacer material feed and vacuum valves were closed off and an inert gas, such as argon, was introduced to pressurize the chamber. This over pressure can force the spacer material (e.g., silicate solution) into small pores. After a given time the spacer material feed valve was opened and the chamber drained under pressure. The excess spacer material was removed from the mold surface. The mold was then placed in contact with a substrate and the molded spacer material then cured onto the substrate.

Referring again to FIGS. 3A through 3G, it has been found that primary positive molds such as mold 302 may be used to produce about ten to fifteen secondary negative molds such as mold 304 before the primary mold 302 becomes unsuitable for further use. A few of the posts 320 of the primary positive mold 302 tend to break off of the support 310 each time a secondary negative mold 304 is separated from the primary mold 302. Since, as discussed above, the necessary yield for producing spacers for an FED is relatively low, a primary mold 302 can be used to produce secondary negative molds 304 even if several of the posts 320 have broken off. However, after about ten to fifteen castings (i.e., after use of the same primary positive mold to produce about ten to fifteen secondary negative molds), enough posts 320 have typically broken off to make the primary mold 302 unsuitable for producing further secondary molds.

One preferred method for using secondary molds, such as mold 304, for producing spacers is as follows. First, the secondary mold is preferably washed to remove any release agents that were used to separate the primary positive and secondary negative molds. The secondary mold is then placed in a vacuum chamber and the apertures of the mold are filled with a spacer material while the mold is under a vacuum. After filling, the surface of the mold is cleaned with a scalpel to remove any excess spacer material from the mold. The mold is then placed in contact with a substrate (e.g., a faceplate of an FED) with the apertures facing down and the substrate below the mold as depicted in FIG. 3F. A rubber membrane is then placed over the mold and a vacuum is drawn in the volume beneath the membrane to remove any air that may be trapped at the interface of the mold and the substrate. The rubber membrane is then drawn down tightly to apply uniform pressure against the mold and thereby squeeze the mold and substrate together. The volume above the rubber membrane is then pressurized in excess of atmospheric pressure to clamp the mold and the substrate together and thereby insure that the spacer material in the mold apertures is in contact with the substrate. After the spacer material has cured, the secondary mold and the substrate are separated leaving an array of spacers on the substrate.

Another variation of this technique is to use a relatively thin ledge (e.g., several millimeters thick) to separate the substrate and a negative mold that has been filled with spacer material. The ledge preferably extends around the outer periphery of the negative mold. When pressure is applied to the top of the mold, the pressure initially pushes the center of the mold into contact with the substrate, but the ledge prevents the outer periphery of the mold from contacting the substrate. As the pressure increases, more and more of the mold is pushed into contact with the substrate and the area of contact gradually extends from the center of the mold out towards the outer periphery. The ledge is preferably placed far enough away from the active area of the mold (i.e., the portion of the mold that includes apertures that have been filed with spacer material) so that the entire active area may be brought into contact with the substrate. The mold is then held in place until the spacer material cures. This technique minimizes the amount of air that is sometimes trapped at the interface of the mold and the substrate and thereby facilitates placing the spacer material into good contact with the substrate.

Figure 8:
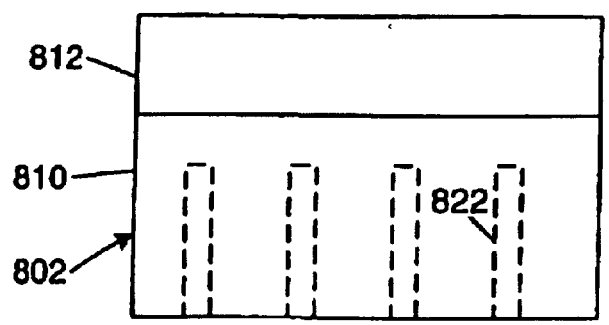
FIG. 8 shows a dual durometer secondary negative mold constructed according to the invention.

One problem that has been encountered in use of negative molds such as mold 304 is that cured spacers may break off of the substrate when the mold and substrate are separated. If the mold is hard or brittle, then the mold fails to deform around the spacers as the mold is pulled away from the substrate and tends to break the spacers off. Conversely, if the mold is soft enough to deform around the spacers then the mold tends to stretch while it is being separated from the substrate and this stretching also tends to break off the spacers. One solution to this problem is to construct a negative mold by bonding two layers of rubber together, each layer being characterized by a different durometer. FIG. 8 shows an example of such a dual durometer mold 802. Mold 802 includes a rubber layer 810 that is characterized by a relatively low durometer (e.g., about 8–10 on the Shore A scale of the American Society for Testing Materials) and a rubber layer 812 that is characterized by a higher durometer (e.g., greater than sixty on the Shore A scale). Layers 810 and 812 are bonded together. As shown, the apertures 822 of the mold are fully defined by the low durometer portion 810. The low durometer portion 810 is high enough to accommodate the apertures 822 (e.g., the low durometer portion may be about 800 microns thick) and the high durometer portion 812 is typically several centimeters thick so that the mold 802 can be easily handled. When the mold 802 is separated from a substrate, the low durometer portion 810 is able to deform around the spacers (rather than breaking them) and the high durometer portion 812 prevents the low durometer portion 810 from stretching enough to break off the spacers.

Figure 9A:
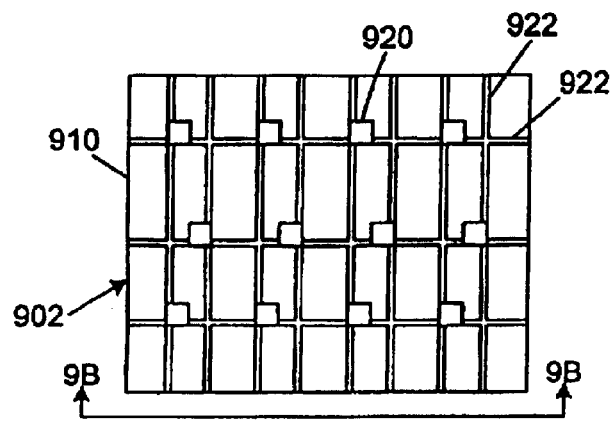
FIG. 9A shows a top view of a primary positive mold constructed according to the invention that includes row and column lines.
Figure 9B:
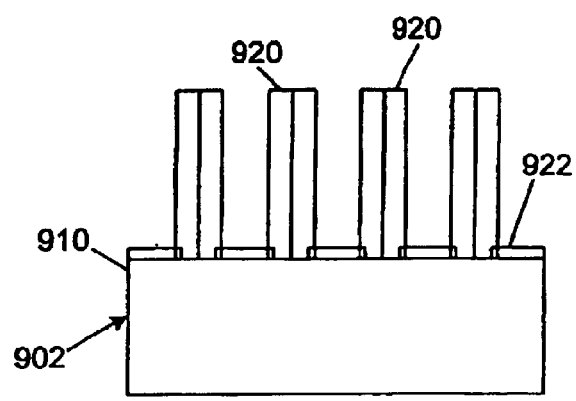
FIG. 9B shows a view of the mold along line 9B—9B as shown in FIG. 9A.

FIG. 9A shows a top view of a small portion of another primary positive mold 902 constructed according to the invention. FIG. 9B shows a view of a small portion of mold 902 taken in the direction of line 9B—9B as shown in FIG. 9A. Similarly to mold 302 (FIG. 3A), mold 902 includes a support 902 (that is typically several centimeters thick) and a plurality of posts 920 (that are about 350 to 700 microns high). However, mold 902 additionally includes a network of row and column lines 922. Each of the posts 920 is intersected by at least one of the row and column lines 922. The row and column lines are substantially shorter than the posts 920. In one embodiment the posts are 350 microns high and the row and column lines are twenty to twenty-five microns high. As will be discussed below, the row and column lines 922 are used to form a network of "vacuum pump out channels" in secondary negative molds formed on positive mold 902.

Molds such as mold 902 can be formed by applying and imaging successive layers of photoresist (e.g., an epoxy bisphenol A novolac resin, such as SU-8) to the support 902. In one preferred method, a layer of SU-8 that is fifty microns thick is deposited over the support 902 and developed to establish a base. Then a second layer of SU-8 is deposited over the first layer and the second layer is then imaged to form the row and column lines. Then a third, thick layer of SU-8 is deposited over the second layer and the third layer is then imaged to form the posts. In general, multiple layers of photoresist can be successively applied and imaged to generate complex shapes such as that of mold 902.

Figure 9C:
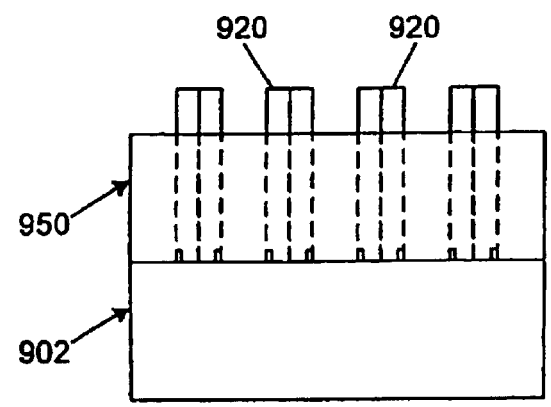
FIG. 9C shows the mold of FIG. 9A being used to construct a negative mold.
Figure 9D:
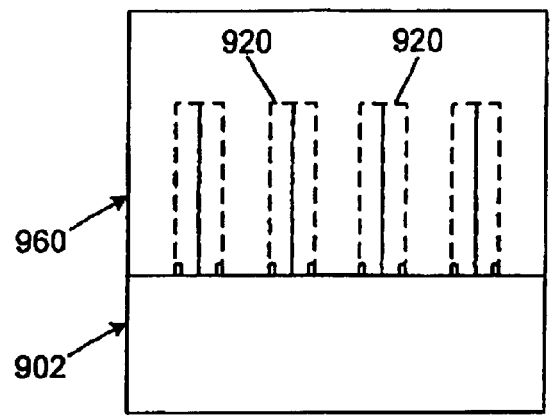
FIG. 9D shows the mold of FIG. 9A being used to construct another negative mold.

FIG. 9C shows a small portion of a secondary negative mold 950 being formed on positive mold 902. As shown, mold 950 is formed by pouring silicone or latex over the positive mold 902 so that the posts 920 project through the silicone layer 950. FIG. 9D shows a small portion of another secondary negative mold 960 being formed on positive mold 902. As shown, mold 960 is similar to mold 950. However, mold 960 is made of a thicker layer of material so that the posts 920 of positive mold 902 do not project through the mold 960. The apertures formed in mold 950 by posts 920 are "through-holes" since they pass entirely through the mold, whereas the apertures formed in mold 960 by posts 920 are "blind holes" (such as the apertures of mold 304 shown in FIG. 3D). After the material used to form the negative mold has cured, the mold (either mold 950 or 960) is separated from the positive mold 902.

Figure 9E:
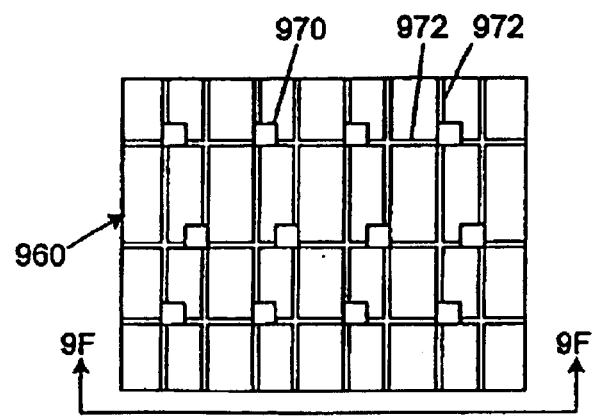
FIG. 9E shows a bottom view of the negative mold of FIG. 9D after the negative mold has been separated from the positive mold.
Figure 9F:
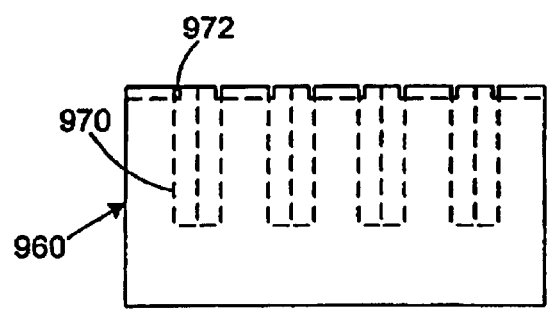
FIG. 9F shows a view of the mold along line 9F—9F of FIG. 9E.

FIG. 9E shows a bottom view of a small portion of the completed mold 960. FIG. 9F shows a side view a small portion of mold 960 taken in the direction indicated by line 9F—9F as shown in FIG. 9E. As shown, mold 960 defines a plurality of apertures (or "blind holes") 970 that correspond to the posts 920 of positive mold 902. Also, mold 960 defines a plurality of vacuum pump out channels 972 that correspond to the row and column lines 922 of positive mold 902. It will be appreciated that mold 950 (FIG. 9C) also defines a plurality of vacuum pump out channels.

One problem with negative molds such as mold 304 (FIG. 3D) is that air (or gas or gaseous material) tends to get trapped between the mold and the substrate and this trapped air tends to prevent the spacer material from becoming reliably attached to the substrate. Even the method discussed above of using a ledge so that contact between the mold and substrate initiates at the center of the mold and gradually extends out to the periphery does not fully eliminate this trapped air. The vacuum pump out channels provide a mechanism for removing air at the interface of the mold and substrate.

Figure 9G:
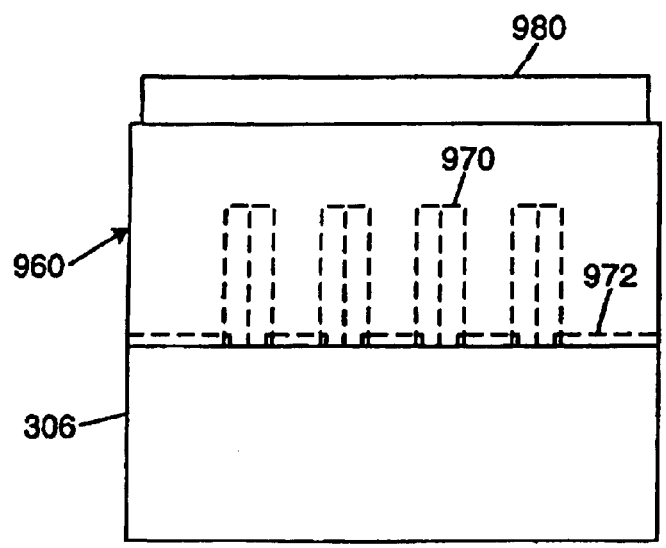
FIG. 9G shows the mold of FIGS. 9E and 9F being used to apply spacers to a substrate.
Figure 9H:
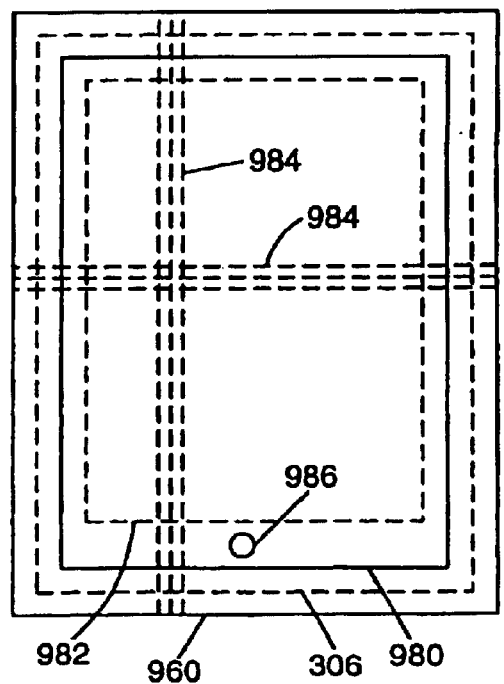
FIG. 9H shows the top view of a mold positioned over a substrate.

FIG. 9G shows a side view of a small portion of mold 960 in contact with a substrate 306 (e.g., a faceplate of an FED). FIG. 9H shows a top view of the entire mold 960 positioned over the entire substrate 306. As shown in FIG. 9H, the substrate 306 is preferably centered under the mold 960 and the edges of the mold 960 normally extend beyond the edges of the substrate. The active area (i.e., the area within which all the emitters, posts, or pixels are disposed) of the substrate 306 is indicated in FIG. 9H by dashed rectangle 982. A clamp ring 980 preferably pushes the mold 960 down onto the substrate 306, and the clamp ring 980 is preferably disposed so that it surrounds the active area 982. The six dashed lines 984 (three horizontal lines and three vertical lines) in FIG. 9H illustrate the vacuum pump out channels 972 that extend throughout the entire mold. The mold 960 also defines an injection port 986. As shown in FIG. 9H, the injection port 986 is preferably positioned within the clamp ring 980 and outside the active area 982. The injection port 986 is an aperture extending vertically through the entire mold 960.

In operation, after the clamp ring has been applied to hold the mold onto the substrate, the vacuum pump out channels 972 can be used to remove any air that has been trapped between the mold and the substrate. For example, the entire assembly including substrate 306, mold 960, and clamping ring 980 may be placed in a vacuum chamber. Evacuating the chamber evacuates all the gas from the environment surrounding the assembly, and the vacuum in the surrounding environment causes any gas trapped between the mold and substrate to be removed via the vacuum pump out channels. Thereafter, the spacer material can be injected into the top of injection port 986. The injected spacer material travels down through the mold towards the vacuum pump out channels 972 (i.e., towards the interface of the substrate and the mold) and suction from the vacuum pump out channels causes the spacer material to spread across the entire mold and to fill all the apertures of the mold. After all apertures have been filled, the spacer material is then allowed to cure. After the spacer material has cured, the mold 960 and substrate 970 are separated leaving the cured spacers attached to substrate 306. Air can be injected into the vacuum pump out channels to facilitate separation of the mold and substrate. During the molding process, the substrate and mold are normally supported by some kind of surface or table. It may also be useful to use a flange to push the outer perimeter of the mold down onto the table during the molding process.

Mold 950 may be used in a similar fashion as mold 960. However, rather than injecting the spacer material into the mold, the spacer material is filled into the mold apertures through the top of the mold (i.e., at the top of the through hole) and a doctor blade can be run over the top of the mold to remove excess spacer material. Although mold 950 is useful, mold 960 is currently preferred because separation of the mold and substrate tends to break off more spacers when mold 950 is used.

Figure 10A:
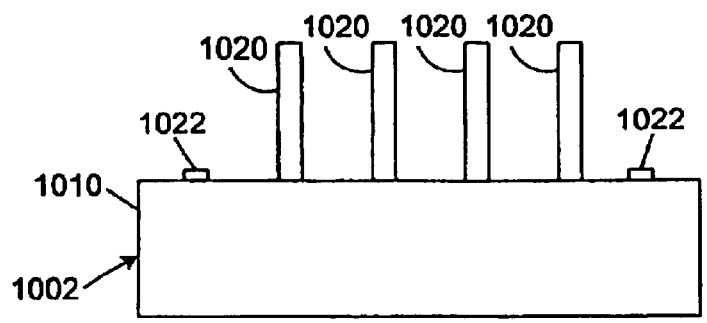
FIGS. 10A and 10B show side and top views, respectively, of a primary positive mold constructed according to the invention that includes alignment marks.
Figure 10B:
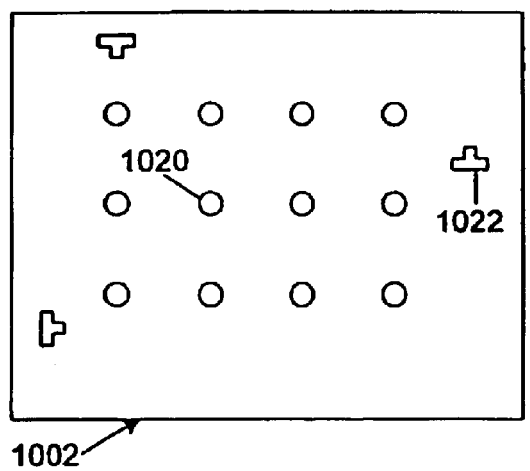

When using a mold to form spacers on a display, it is very desirable to be able to accurately align the mold with the substrate so that the spacers are located at desirable positions within the display. One method according to the invention for improving the alignment of the mold with respect to the substrate of the display shall now be described. Initially a primary positive mold (e.g., such as mold 302 of FIG. 3A) is prepared so that alignment marks are included on the mold. FIGS. 10A and 10B show side and top views, respectively, of an example of such a mold 1002 that includes a support 1010, a plurality of posts 1020 and a three alignment marks 1022. Mold 1002 is shown including three T-shaped alignment marks, but it will be appreciated that any configuration of alignment marks may be used. Mold 1002 is preferably formed using multiple layers of photoresist as has been discussed above. That is, one layer of photoresist is applied to the support and imaged to form the alignment marks. Then, another layer of photoresist is applied and imaged to form the posts 1020.

Figure 10C:
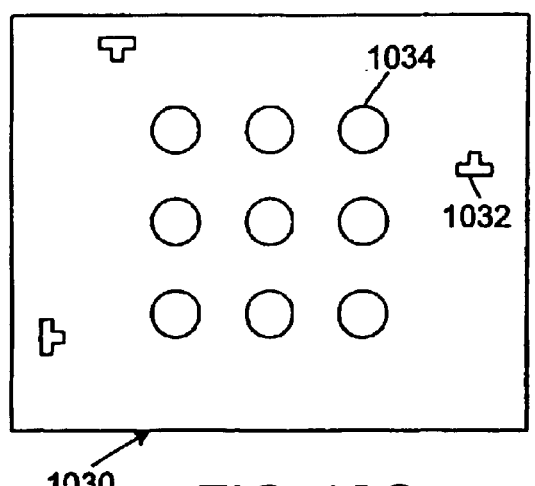
FIG. 10C shows an alignment sheet constructed according to the invention.

The mold 1002 is then used to prepare a secondary negative mold. The first step in preparing the secondary negative mold is to prepare a sheet of perforated metal (e.g, spring steel that is 0.001 inches thick) that has alignment apertures that match the marks of positive mold 1002. FIG. 10C shows a top view of such a sheet of spring steel 1030. Sheet 1030 includes apertures 1032 that exactly match the alignment marks 1022 of mold 1002. Sheet 1030 also includes a plurality of perforations 1034.

Figure 10D:
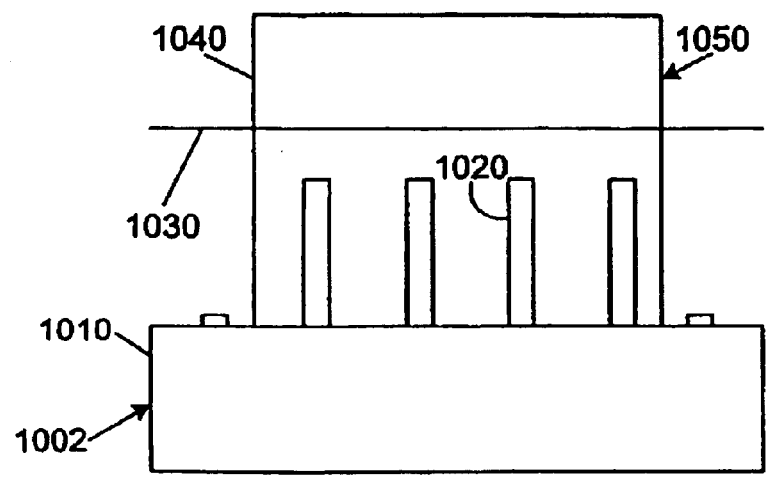
FIG. 10D shows a negative mold being formed according to the invention using the alignment sheet of FIG. 10C and the positive mold of FIGS. 10A and 10B.

FIG. 10D illustrates the production of a secondary mold 1050 that includes sheet 1030. First, the sheet 1030 is held in place so that the alignment apertures 1032 of sheet 1030 are aligned with the alignment marks 1022 of positive mold 1002. Then, silicone or another resilient material 1040 is poured over mold 1002 so that the material 1040 surrounds the perforated portion of sheet 1030, conforms to the posts 1020 of mold 1002, and does not extend over the alignment apertures of sheet 1030. After the material 1040 cures, the sheet 1030 is permanently embedded into (and becomes a "spine" of the material 1040. The finished mold 1050 includes the cured material 1040 and the sheet 1030.

After the mold 1050 is separated from positive mold 1002, the sheet 1030 comprises an alignment template for the mold 1050. The sheet 1030 is flexible and permits the mold to flex or bend, but the sheet 1030 will not stretch or otherwise permanently deform. Mold 1050 may then be used with substrates that include alignment marks matching the alignment apertures of the sheet 1030. The alignment apertures of the mold 1050 are aligned with the alignment marks of the substrate and this alignment is maintained as the substrate and mold are brought into contact. In this way, the accuracy of the photolithography process (used to create the positive mold 1002) is transferred to the substrate and the spacers are placed at desired locations on the substrate.

Figure 11:
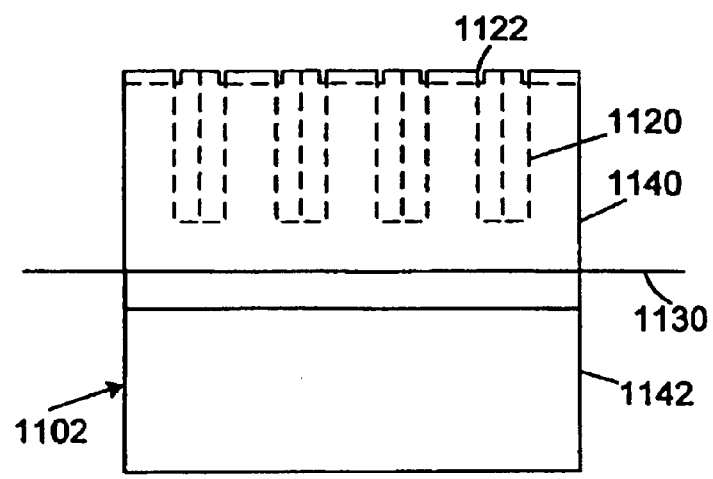
FIG. 11 shows a preferred secondary negative mold constructed according to the invention.

FIG. 11 shows an example of a preferred secondary negative mold 1102 constructed according to the invention. Mold 1102 includes a plurality of apertures 1120 corresponding to posts of a positive mold (and to spacers of a display). Mold 1102 also includes a plurality of vacuum pump out channels 1122 (similar to the channels 972 of mold 960 shown in FIG. 9F). Mold 1102 also includes a metal alignment sheet 1130 (similar to sheet 1030 of mold 1002 shown in FIGS. 10C and 10D). Mold 1102 also includes a low durometer portion 1140 bonded to a high durometer portion 1142. Low durometer portion 1140 defines all of the apertures 1120. The alignment sheet is shown as being embedded in the low durometer portion 1140 however, the alignment sheet could alternatively be embedded into the high durometer portion.

In use, the alignment apertures of the alignment sheet 1130 of mold 1102 are first aligned with the alignment marks of a substrate. Then the mold 1102 and substrate are brought into contact while maintaining alignment of the alignment marks of the substrate and the alignment apertures of the sheet 1130. Then a clamping ring (similar to the ring 980 shown in FIG. 9G) is applied to the outer periphery of the mold 1102 to hold the outer periphery securely against the substrate. After the clamping ring has been so applied, the vacuum pump out channels 1122 are used to evacuate trapped gas (e.g., air) from between the interface of the substrate and the mold 1102. Then the spacer material is injected into the apertures of the mold 1102 using standard injection molding techniques. About five cubic centimeters of spacer material are typically injected into the mold to provide enough material for all the spacers in a display having an active area of 80 square inches. Then the spacer material is allowed to cure. After this curing, the mold 1102 and substrate are separated. Air may be pumped into the vacuum pump out channels to facilitate this separation. Thereafter, the hardened spacer material that has attached to the substrate may be air dried and then fired to fully cure the spacers.

EXAMPLES

The following examples are for purposes of illustration only, and are not intended to limit the scope of the invention or the claims.

Example 1

Glass-Resist Adhesion

A mold fabricated from SU-8 can be formed as described herein. Briefly, a support, such as soda lime glass, is cleaned and coated with a thin film of SU-8 resist (e.g., about 50 $\mu$m), which is then flood exposed to completely cure the SU-8 resist. A thicker film of the SU-8 resist is then applied (e.g., 200–600 $\mu$m), exposed with the desired photopattern, baked, and developed in a PGMEA solvent. Negative resist allows the process of coating, exposing and developing to be repeated, such that a complex 3D shape can be formed.

As described herein, adhesion of the SU-8 resist to a glass support can be poor, such that delamination occurs when the SU-8 resist exceeds a thickness of 200 $\mu$m. A search for possible priming methods was carried out in three broad categories: (1) cleaning processes that leave the surface hydrophilic; (2) cleaning processes that leave the surface hydrophobic; and (3) depositing several monolayers of molecules to promote adhesion. Table 2 shows the wetting behavior of the support for different surface treatments. Treatments that left the surface hydrophilic promoted wetting of the SU-8 resist to the substrate. On the other hand, adhesion promoters such as HMDS, surfasil, $FRSiCl_3$ and octadecyltrichlorosilane failed to promote adhesion between the glass support and the SU-8 resist.

Taking the surface conditions into account along with the solubility of the monomer in polar organic solvents, it was decided that a better adhesion promoter would be terminated in hydroxyl groups. Accordingly, triethanol amine was dissolved in methanol, and glass supports were soaked for 3–5 minutes therein, then air dried. A two level Toguchi test was performed with factor one being the presence of the priming agent and factor two being the temperature of the post-exposure bake. Temperature was the primary factor that effected adhesion with 56% probability, and the primer was the secondary factor that effected adhesion with 24% probability comparing 95° C. PEB with 115° C. PEB.

Surface treatments with triethanol amine significantly increased the adhesive strength. This was demonstrated by a major reduction in undercutting of small features during development. Environmental testing of the resist in the presence of water, however, showed the same failure rates as unprimed material.

Figure 12:
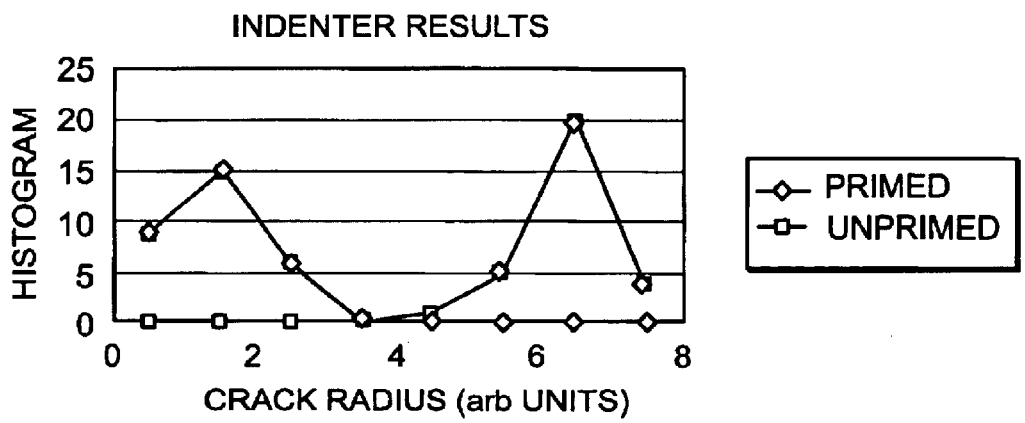
FIG. 12 is a crack test graph showing that surface treatments of a glass support with a priming agent (i.e., 2(3,4-epoxycyclohexyl)ethyltriemthoxysilane) significantly increased the adhesive strength between the glass support and the SU-8 resist when compared to the adhesive strength between an unprimed glass support and the SU-8 resist.

Surface treatments with 2(3,4-epoxycyclohexyl) ethyltrimethoxysilane significantly increased the adhesive strength between the glass support and the SU-8 resist, as shown in the crack test graph in FIG. 12. A sharp indenter was pressed against the SU-8 resist until it broke through to the glass support. The area delaminated by this process was measured using a microscope. The relative areas lifted are inversely proportional to the bond strength. As shown in FIG. 12, the indenter produced smaller cracks in the 2(3,4-epoxycyclohexyl)ethyltrimethoxysilane-primed areas than in the unprimed areas. Specifically, the change in area from unprimed to 2(3,4-epoxycyclohexyl)ethyltrimethoxysilane-primed was 36 times. In some of the 2(3,4-epoxycyclohexyl) ethyltrimethoxysilane-primed cases, no lifting was detected except for the immediate damage caused by the indenter.

Example 2

Modification of SU-8

Figure 13A:
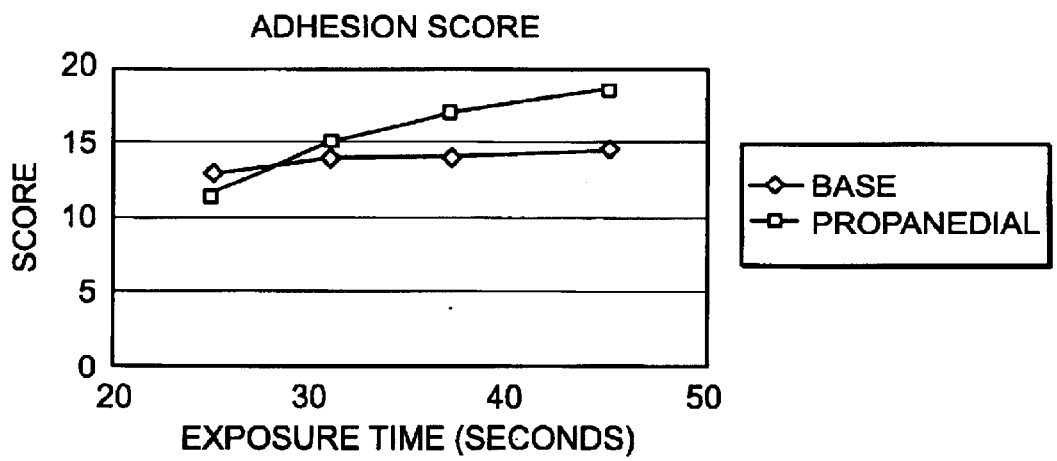
FIGS. 13A–B show that mixing propanediol (FIG. 13A) and hexanediol (FIG. 13B) with an SU-8 resist produce an SU-8 resist with superior properties.
Figure 13B:
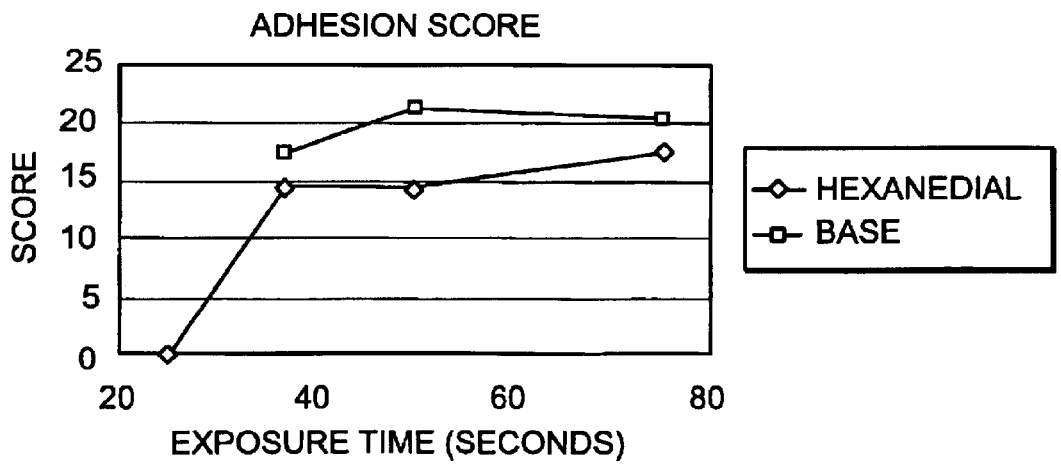

Propanediol and hexanediol were added to an SU-8 resist to determine the effects on the properties of the SU-8. As shown in FIGS. 13A–B, the photospeed of the propanediol/SU-8 mix and the hexanediol/SU-8 mix was faster than the photospeed of the SU-8 alone, and the adhesive strength of the propanediol/SU-8 mix with the support and the hexanediol/SU-8 mix with the support was better than the adhesive strength of the SU-8 alone.

Example 3

Sol Gel Post-Mold Treatment

After the sol gel spacers are formed, they must be washed and dried, as described herein.

Washing the wet gels in deionized water can lead to swelling and cracking if care is not taken to balance the osmotic pressure between the solvent and the gel network. Sol gels will match the dilution of the ionic species it is immersed in by swelling or shrinking. Since the sol gels of the present invention contain a large amount of sodium and potassium, they will swell and rupture when placed in deionized water. When the sol gels of the present invention are washed in a solution of deionized water saturated with NaCl, they tend to shrink and expel water because the ion concentration gradient is higher outside the gel than inside. Thus, it has been found that a 1–10% solution of HCl in deionized water can effectively wash the sol gels of the present invention without swelling.

After washing, the gels must be dried. An increasing temperature cycle produces dense sol gel spacers that are well-bonded to the substrate.

First, a temperature of 110° C. is required to remove bulk water from the gel. This may be performed in air or a vacuum. Initially, a 40–70° C. pre-bake is performed to remove the bulk water by evaporation. This was shown to close off the pores and seal the interior of the gel. When heated to about 100° C., the gel would swell from steam build-up, creating bubbles which led to rupture. Going directly from the acid wash to 110° C. has been shown to be an effective means of drying. The time required for this step is about 24 hours.

The next ramp temperature is 120° C. There is a transition between 110° C. and 120° C. in the behavior of the drying process. Below 120° C., the bulk water is evaporated from the gel. At 120° C. and above, water adsorbed on the surface of the silica begins to evaporate. The time required for this step is about 4 hours.

At 150° C., the hydroxyl groups on the surface of the silica begin to condense in the reaction: —Si—OH+HO—Si—→Si—O—Si—+$H_2O$. This process is responsible for turning the gel into an insoluble porous glass.

The process continues at 170–180° C., where the silanol groups quickly condense. At this stage, the mechanical properties of the glass improve as the bonds between the particles of silica in the network get stronger.

Organic burnout is accomplished at 270° C., followed by a ramp to 430–460° C. where the porous gel consolidates.

Each of the patents and publications cited herein is incorporated by reference herein in its entirety.

Although the invention has been set forth in detail and with reference to examples, one skilled in the art will appreciate that changes and modifications can be made to the invention without departing from the spirit and scope of the invention.

TABLE 1

| mol % by batch | | $Na_2O$—$K_2O$—$SiO_2$ Systems t, ° C. at log η (P) | | | | | |
|---|---|---|---|---|---|---|---|
| $Na_2O$ | $K_2O$ | 8 | 9 | 10 | 11 | 12 | 13 |
| 3 | 2 | — | 808 | 758 | 712 | 667 | 628 |
| 2 | 3 | — | 796 | 746 | 702 | 658 | 621.5 |
| 1 | 4 | — | 797 | 744 | 694 | 651 | 612 |
| 0 | 5 | 838 | 777 | 722 | 675.5 | 632 | 592 |
| 13 | 0 | — | 712 | 675 | 641 | 607 | 578 |
| 11 | 2 | — | 662 | 624 | 588 | 557 | 524 |
| 9 | 4 | 692 | 645 | 601 | 562 | 526 | 493 |
| 7 | 6 | 688 | 637 | 591 | 547 | 511 | 476 |
| 5 | 8 | 693 | 643 | 597 | 557 | 517 | 482 |
| 3 | 10 | 683 | 633 | 589 | 550 | 512 | 479 |
| 0 | 13 | 702 | 655 | 612 | 578 | 547 | 517 |
| 20 | 0 | 652 | 607.5 | 571 | 532 | 502 | 473 |
| 18 | 2 | 616 | 571 | 532 | 502 | 472 | 444 |
| 16 | 4 | 600 | 561 | 527 | 493 | 466 | 437 |
| 14 | 6 | 608 | 557 | 517 | 485 | 456 | 428.5 |
| 12 | 8 | 609 | 563 | 524 | 489 | 458 | 429 |
| 10 | 10 | 605 | 563 | 526 | 493 | 465.5 | 437 |

TABLE 1-continued

| mol % by batch | | $Na_2O$—$K_2O$—$SiO_2$ Systems t, ° C. at log η (P) | | | | | |
|---|---|---|---|---|---|---|---|
| $Na_2O$ | $K_2O$ | 8 | 9 | 10 | 11 | 12 | 13 |
| 5 | 15 | 632 | 582 | 543 | 512 | 479 | 451 |
| 0 | 20 | 662 | 621 | 583 | 550 | 518 | 491 |

The data shown in Table 1 was taken from page 30 of the *Handbook of Glass Data*, Part C, Ternary Silicate Glasses, by Mazurin, Streltsina and Shvaiko-Shvaikovskaya.

TABLE 2

| Surface Treatment | Results |
|---|---|
| Surfasil | poor wetting |
| hot phosphoric acid | wet surface |
| HMDS | poor wetting |
| $FRSiCl_3$ | would not wet |
| Con HCl, IPA | very good wetting |
| control | good wetting |
| $NH_4OH$ | very good wetting |
| KOH, 100C | good wetting |
| HF 100:1 | good wetting |
| octodecyltrichlorosilane | patchy wetting |
| control | wet |
| $NH_4OH:H_2O_2$ | good wetting |

What is claimed is:

1. A method of forming spacers in a display comprising:
   forming a positive mold by depositing a layer of photoresist on a support and patterning the layer of photoresist to define an array of posts;
   forming a resilient negative mold by depositing a material over the positive mold, the material conforming to the array of posts, allowing the material to cure, and separating the cured material from the positive mold, the negative mold defining an array of apertures, each of the apertures corresponding to one of the posts;
   placing the negative mold in contact with a substrate;
   filling the apertures with a spacer material;
   allowing the spacer material to cure; and
   separating the negative mold and the substrate.

2. A method according to claim 2, wherein the negative mold comprises a first layer of material characterized by a first durometer and a second layer of material characterized by a second durometer, the second durometer being higher than the first durometer, the first layer defining the array of apertures.

3. A method according to claim 1, wherein the negative mold comprises an alignment sheet, the alignment sheet defining two or more alignment apertures.

4. A method according to claim 3, wherein the alignment sheet is metallic.

5. A method according to claim 1, wherein filling the apertures with spacer material comprises injecting the spacer material into the negative mold.

6. A method according to claim 1, wherein the negative mold comprises a plural of vacuum pump out channels.

* * * * *